US012585838B2

(12) United States Patent
El-Ferik et al.

(10) Patent No.: US 12,585,838 B2
(45) Date of Patent: Mar. 24, 2026

(54) STICTION CONTROL SYSTEM AND METHOD FOR CONVENTIONAL VALVES

(71) Applicants: KING FAHD UNIVERSITY OF PETROLEUM AND MINERALS, Dhahran (SA); Yokogawa Saudi Arabia Company, Al-Khobar (SA)

(72) Inventors: Sami El-Ferik, Dhahran (SA); Mustafa Alnaser, Al-Khobar (SA)

(73) Assignees: KING FAHD UNIVERSITY OF PETROLEUM AND MINERALS, Dhahran (SA); Yokogawa Saudi Arabia Company, Al-Khobar (SA)

( * ) Notice: Subject to any disclaimer, the term of this patent is extended or adjusted under 35 U.S.C. 154(b) by 918 days.

(21) Appl. No.: 17/868,254

(22) Filed: Jul. 19, 2022

(65) Prior Publication Data

US 2024/0037291 A1    Feb. 1, 2024

(51) Int. Cl.
*G06F 30/17* (2020.01)
*F16K 37/00* (2006.01)
(Continued)

(52) U.S. Cl.
CPC .......... *G06F 30/17* (2020.01); *F16K 37/0083* (2013.01); *G06F 30/20* (2020.01); *G06F 30/23* (2020.01)

(58) Field of Classification Search
CPC .......... G06F 30/17; G06F 30/12; G06F 30/20; G06F 30/25; G06F 30/27; G06F 30/28;
(Continued)

(56) References Cited

U.S. PATENT DOCUMENTS

2013/0085717 A1    4/2013  Selvaraj et al.
2017/0175920 A1*   6/2017  El Ferik .............. G05B 13/041

FOREIGN PATENT DOCUMENTS

EP           1 776 622 B1     8/2012

OTHER PUBLICATIONS

Brasio, Ana SR, Andrey Romanenko, and Natercia CP Fernandes. "Modeling, detection and quantification, and compensation of stiction in control loops: The state of the art." Industrial & Engineering Chemistry Research 53.39 (2014): 15020-15040. (Year: 2014).*

(Continued)

*Primary Examiner* — Michael Edward Cocchi
(74) *Attorney, Agent, or Firm* — Oblon, McClelland, Maier & Neustadt, L.L.P.

(57) ABSTRACT

Stiction analysis of a conventional or legacy valve operation in a fluid process plant is described. The method includes receiving a series of setpoint signals, SP, generating, by the controller, a series of controller output signals, OP, driving the valve operation by applying the OP, to the valve, measuring a series of process variable signals, PV, downstream of the valve, receiving the series of process variable signals at the controller, performing inverse modelling on the PV, to estimate a manipulated variable, $\widehat{MV}$, receiving and analyzing by a system processor, the SP, the OP, and the $\widehat{MV}$, and outputting the estimated stick values, S, the estimated jump values, J, an average of the estimated stick values, an average of the estimated jump values, a confidence interval for the average of the stick values, and a confidence interval for the average of the jump values.

21 Claims, 18 Drawing Sheets

100

(51) Int. Cl.
    *G06F 30/20*       (2020.01)
    *G06F 30/23*       (2020.01)

(58) Field of Classification Search
    CPC ...... G06F 30/23; G06F 30/367; G06F 30/398;
                  F16K 37/0083; F16K 31/12; G05B
                           13/041; G06N 3/126
    See application file for complete search history.

(56)                    References Cited

OTHER PUBLICATIONS

Muhammad, Sabih. Detection and compensation of valve stiction in control loops. Diss. King Fahd University of Petroleum and Minerals, 2010. (Year: 2010).*

Qi, Fei, and Biao Huang. "Estimation of distribution function for control valve stiction estimation." Journal of Process Control 21.8 (2011): 1208-1216. (Year: 2011).*

Di Capaci, et al. ; Valve Stiction Quantification: a Robust Methodology to Face Most Common Causes of Loop Perturbations ; Chemical Engineering Transactions, vol. 32, 2013 ; 6 pages.

Hutabarat, et al. ; Detection and quantification of valve stiction based on normality test and Hammerstein system identification ; AIP Conference Proceedings 1755 ; Jul. 21, 2016 ; 7 Pages.

* cited by examiner

300A

Data Analysis

910

912
914

1100

STICTION CONTROL SYSTEM AND METHOD FOR CONVENTIONAL VALVES

CROSS REFERENCE TO RELATED APPLICATIONS

The present application is related to U.S. application Ser. No. 17/353,080, entitled "Control Loop Performance Advisory Tool", filed on Jun. 21, 2021, and incorporated herein by reference in its entirety.

BACKGROUND

Technical Field

The present disclosure is directed to a pneumatically controlled valve system and a stiction control system and method for conventional valves.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

A process or a production plant may have a plethora of control loops which interact with one another. Any fault or failure in a given control loop may negatively affect downstream or upstream loops, and thus propagate through the interacting control loops to create a plant-wide disturbance. These control loops suffer from oscillations, poor disturbance rejection, poor set-point tracking, and poor controller tuning. Stiction (static friction nonlinearity) is a root cause of periodic oscillations or cycling in control loops. Taking into account non-linear dynamics due to stiction in the control strategy may enhance the control loop performance, which in turn will improve the product quality, plant economy, and safety.

The Instrument Society of America (ISA) defines stiction as: "the resistance to the start of the motion, usually measured as the difference between the driving values required to overcome static friction upscale and downscale" (ISA Subcommittee SP75.05, 1979). Valve stiction is inherently a physical problem, and the way to resolve it has been through periodical valve maintenance, which is typically between 6 months to 3 years, or when the level of stiction is above a given threshold that varies from plant to plant and typically is within 3% to 10% of the input signal. Shutting down the process to perform the maintenance causes the production line to be shut down, especially when there is no bypass line. The loss of energy and product quality due to cycling induced by the stiction and income loss due to production shutdown to perform maintenance can be quite high. For these reasons, identification, analysis, quantification, and compensation for stiction are needed to ensure improved asset management, high-quality product, better energy management, cost reduction and higher savings.

To address the problems of valve stitction, a valve may have a valve positioner that measures or determines the valve position and communicates the valve position to the operator device or computing devices for stiction calculation. These valves are called smart valves and may communicate operation data to an operator device or computing devices for monitoring. The operator or the devices may determine the stiction based on the operation data and take steps to compensate the stiction. However, many industries still operate with conventional or legacy valves. These industries may have plant configurations that does not have the ability to incorporate the smart valve technologies to in order to determine valve stiction. As a result, these industries suffer from aforementioned problems of valve breakdown or slowdown due to maintenance of the conventional valves. Therefore, means to determine valve stiction or failing of conventional valves is needed.

Accordingly, it is one object of the present disclosure to provide methods and systems for a stiction control of conventional valves.

SUMMARY

In an exemplary embodiment, a method for stiction analysis of a valve operation in a fluid process plant is described. The method includes receiving, by a controller, a series of setpoint signals, SP, during a sampling interval, generating, by the controller, a series of controller output signals, OP, driving the valve operation by applying the series of controller output signals, OP, to the valve, measuring a series of process variable signals, PV, downstream of the valve, receiving the series of process variable signals at the controller, performing inverse modelling on the series of process variable signals, PV, to estimate a manipulated variable, $\widehat{MV}$, receiving, within a sampling interval, by the system processor, the series of setpoint signals, SP, the series of controller output signals, OP, and the estimated manipulated variable, $\widehat{MV}$, analyzing, by the system processor, the series of setpoint signals, SP, the series of controller output signals, OP, and the estimated manipulated variable, $\widehat{MV}$, to estimate stick values, S, and jump values, J, in the valve operation during the sampling interval, and outputting, by the system processor, the estimated stick values, S, the estimated jump values, J, an average of the estimated stick values, an average of the estimated jump values, a confidence interval for the average of the stick values, and a confidence interval for the average of the jump values.

In another exemplary embodiment, a system for stiction analysis of valve operation in a fluid process plant is described. The system includes a controller configured to receive a series of setpoint signals, SP, during a sampling interval and generate a series of controller output signals, OP, a valve having an actuator, wherein the valve is configured to be opened and closed by the actuator to control a flow of a fluid through the valve, and wherein the actuator is configured to be driven by the series of controller output signals, OP, a process variable sensor located downstream of the valve, the process variable sensor configured to detect changes in a flow rate of the fluid, and transmit process variable signals to the controller, a system processor including circuitry, a memory configured to store program instructions and at least one operation processor configured to execute the program instructions, the system processor configured to receive the setpoint signals, the controller output signals, the process variable signals, and estimate a manipulated variable, $\widehat{MV}$, by inverse modelling of the process variable signals, a stiction processor configured to estimate stick values, S, and jump values, J, of the valve during the sampling interval, and a display located in the system processor, wherein the system processor is configured to render on the display, the estimated stick values, S, the estimated jump values, J, an average of the estimated stick values, an average of the estimated jump values, a confidence interval for the average of the stick values, and a confidence interval for the average of the jump values.

The estimated stick values, S, the estimated jump values, J, the average of the estimated stick values, the average of the estimated jump values, the confidence interval for the average of the stick values, and the confidence interval for the average of the jump values may be used by a plant operator at the operation workstation 110 to make decisions as to whether a valve is so faulty it must be replaced. Additionally, the operation may be configured with an alarming system which provides an audible alarm, displays an alert, and the like when stick values and jump values exceed a threshold. The operator may adjust the set point values slightly to stop the alarm when the valve is only slightly faulty. The operator may schedule a repair time for the valve, when the stick and jump values exceed the threshold.

In another exemplary embodiment, a non-transitory computer readable medium having instructions stored therein that, when executed by one or more processors, cause the one or more processors to perform a method or stiction analysis of valve operation in a process plant. The method includes receiving, by a controller, a series of setpoint signals, SP, during a sampling interval, generating, by the controller, a series of controller output signals, OP, driving the valve operation by applying the series of controller output signals, OP, to the valve, measuring a series of process variable signals, PV, downstream of the valve, feeding back the series of process variable signals to the controller, performing inverse modelling on the series of process variable signals, PV, to estimate a manipulated variable, $\widehat{MV}$, receiving, within a sampling interval, by the system processor, the series of setpoint signals, SP, the series of controller output signals, OP, and the estimated manipulated variable, $\widehat{MV}$, analyzing, by the system processor, the series of setpoint signals, SP, the series of controller output signals, OP, and the estimated manipulated variable, $\widehat{MV}$, to estimate stick values, S, and jump values, J, in the valve operation during the sampling interval, and outputting, by the system processor, the estimated stick values, S, the estimated jump values, J, an average of the estimated stick values, an average of the estimated jump values, a confidence interval for the average of the stick values, and a confidence interval for the average of the jump values.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
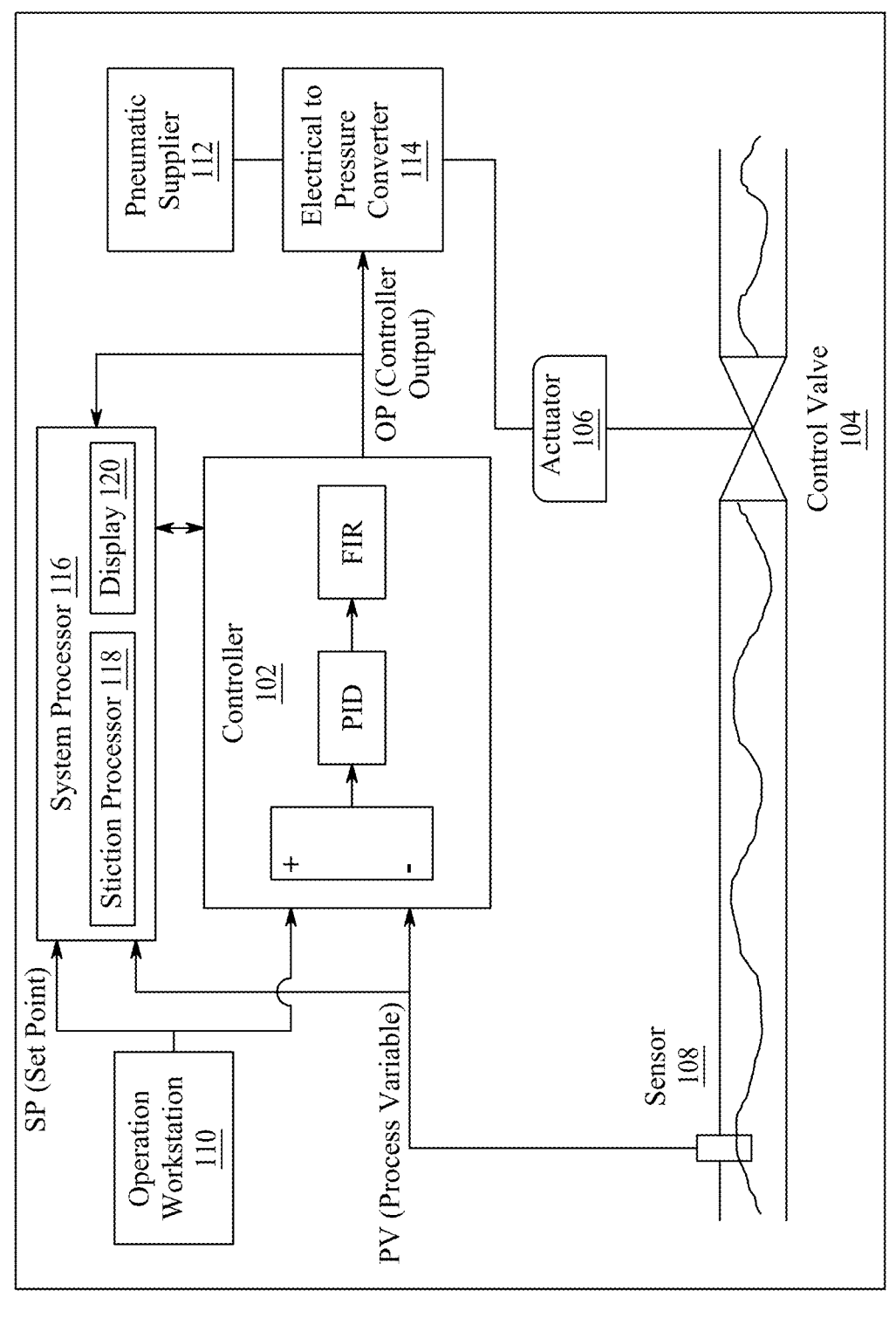
FIG. 1 depicts a schematic diagram of a pneumatically controlled valve system, according to exemplary aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

A conventional valve is defined as a valve which does not provide feedback to a controller regarding its operation, unlike "smart valves", "intelligent valves" and the like, which include a feedback circuit. In a conventional valve, operational characteristics must be derived from downstream sensors, such as flow sensors used in hydraulic applications. Conventional valves may be referred to as "legacy" valves, i.e., valves which were developed before smart valves became available, and which are still used in many plants.

Aspects of this disclosure are directed to a system, device, and method for stiction analysis of valve operation for conventional valves. An examples of a conventional valve is a sliding stem control valve such as a gate valve, which is a common conventional control valve used in industry. The present disclosure describes receiving a series of setpoint signals, SP, generating a series of controller output signals, OP and driving the valve operation by applying the series of controller output signals, OP, to the valve. A system processor is configured to perform analysis of the valve operation by measuring a series of process variable signals, PV, at an output of the valve and estimating a manipulated variable, $\widehat{MV}$, of the valve by inverse modelling of the series of process variable signals, PV. The system processor receives and analyzes, within a sampling interval, the series of setpoint signals, SP, the series of controller output signals, OP, and the estimated manipulated variable, (MV) to determine stick values, S, and jump values, J, in the valve operation. The system processor outputs the stick, S, and jump values, J, an average of the stick values, an average of the jump values, a confidence interval for the average of the stick values, and a confidence interval for the average of the jump values. The system, method and device is explained in detail below.

FIG. 1 depicts a schematic diagram of a pneumatically controlled valve system 100, according to exemplary aspects of the present disclosure.

The pneumatically controlled valve system 100 may include a controller 102, a control valve 104, an actuator 106, a sensor 108, an operation workstation 110, a pneumatic supplier 112, an electrical to pressure converter 114, and a system processor 116. Throughout the present disclosure, the control valve 104 refers to the legacy valve or the conventional valve. The disclosure is focused on stiction analysis of valve operation for legacy or conventional valves. However, aspects of the present disclosure can also be equally applied to systems having smart valves or other components for determining stiction, for validation of the stiction.

The controller 102 calculates a control signal to control the actuator 106. The sensor 108 detects output information of the pneumatically controlled valve system 100. In an example, the sensor 108 may be a flow transmitter that detects flow information (for example, flow speed or flow amount) of substance flowing into or out of the control valve 104 (hereinafter alternatively referred to as 'the valve 104') actuated by the actuator 106, and outputs the flow information as the output information, i.e., process variable (PV) of the pneumatically controlled valve system 100. In another example, the sensor 108 may be a level transmitter that detects level information (for example, height or amount) of the substance in a tank connected to the control valve 104, and outputs the level information as the output information, i.e., the process variable (PV) of the pneumatically controlled valve system 100. The control valve 104 as discussed may be a sliding stem control valve such as a gate valve which are common conventional control valves used in industry.

The controller 102 may receive the output information (the PV from the sensor 108 and a set-point (SP)) from the operation workstation 110. The controller 102 may calculate the control signal, that is, controller output (OP), to control the actuator 106 based on the difference between the PV and the SP and determine the control signals to compensate for the stiction. The controller 102 may calculate the OP by compensating for a linear dynamic and a non-linear dynamic of the actuator 106 using a stable inverse model of the control valve 104. The non-linear dynamic of the actuator 106 may be caused by static friction (stiction), which also causes a stick and jump valve behavior of the control valve 104. The system processor 116 determines and analyzes the static friction which is explained in detail below.

In implementations, the controller 102 may use a finite impulse response (FIR) filter to calculate the OP. In examples, the controller 102 optimizes parameters of a compensator such that a difference between the output information (the PV or the MV) of the pneumatically controlled valve system 100 and the SP or OP, respectively is reduced. In a non-limiting example, the compensator may be a finite impulse response (FIR) based model.

The pneumatically controlled valve system 100 may include the system processor 116 configured to receive the SP signal, the OP signal and the PV signals, and estimate a manipulated variable, $\widehat{MV}$, by inverse modelling of the PV signals. The system processor 116 may implement an advisory tool system for performing analysis of stiction of the control valve. The system processor 116 may include a stiction processor 118 and a display 120. The stiction processor 118 may be configured to estimate stick values, S, and jump values, J, of the valve 104 during sampling intervals. The system processor 116 is configured to render on the display 120, the estimated stick values, S, the estimated jump values, J, an average of the estimated stick values, an average of the estimated jump values, a confidence interval for the average of the stick values, and a confidence interval for the average of the jump values. The estimation of the $\widehat{MV}$ and estimation of stick values, S, and jump values, J, of the valve 104 is explained in greater detail in the below figures.

The controller 102 may control the actuator 106 based on the difference between the input information and the output information determined by the system processor 116. The system processor 116 feeds the difference to the controller 102 that calculates the control signal needed to minimize the difference (error), which in turn minimizes the oscillation of the control valve output.

The system processor 116 may send the $\widehat{MV}$ to the controller 102 to perform an optimization process. The controller 102 may include a Proportional-Integral-Derivative (PID) controller to perform a simple control loop and perform an optimization process locally. The optimization process is performed to reduce or minimize a sum of square error, which is the difference between the OP (i.e., a PID control signal) and the $\widehat{MV}$.

The control signal (or the OP) output from the controller 102 is input to the electrical to pressure converter 114. The electrical to pressure converter 114 controls pneumatic pressure supplied from the pneumatic supplier 112 based on the OP to control the actuator 106.

In examples, the set point (SP) may correspond to a desired reference information, which may include predetermined values for one or more of the flow information, and the level information. In an example, the SP may be input to the controller 102 from the operation workstation 110, for example, via a user interface of a computing device. In some examples, the SP may be input to the controller 102 from the operation workstation 110 automatically without human intervention.

The operation workstation 110 may function as a user interface of controller 102 to provide necessary instructions to the controller 102. For example, the operation workstation 110 may activate a compensation method to compensate for the non-linear dynamic of the actuator 106 as performed by the controller 102, tune settings of the parameters of the compensator of the control valve 104, and select objective functions (for example, select between a first function using a difference between SP and PV and a second function using a difference between the PID control signal, OP, and the $\widehat{MV}$) to optimize the parameters of the compensator.

The controller 102 may be programmed to function as, for example, a linear PID controller and a FIR filter and perform a tuning algorithm to optimize the parameters of the FIR filter. The controller 102 may be further programmed to compare the PV and the SP. Furthermore, the controller 102 may be programmed to include one or more algorithms (not shown) to optimize parameters of the linear PID controller and a FIR filter to eliminate or mitigate stiction.

As described, the system processor 116 performs inverse modelling on the series of process variable signals, PV, to estimate a manipulated variable, $\widehat{MV}$. A process for estimating $\widehat{MV}$ is provided below.

The system processor 116 identifies the valve operation as a linear process based on the PV and the OP. The system processor 116 forms a model training dataset from a first half of the PV signals, and a respective first half of the OP signals. Using a second half of the PV signals, and a respective second half of the OP signals, the system processor 116 forms a model validation dataset. The system processor 116 trains a first inverse auto regressive exogenous, ARX, linear model by performing inverse modelling on the first half of the series of PV signals of the model training dataset, comparing the respective first half of the series of controller output signals to an output of the first inverse ARX model, and estimating a first set of parameters of the first inverse ARX linear model. The system processor 116 validates the first set of parameters by applying the trained first inverse ARX linear model to the second half of the series of PV signals of the model validation dataset and comparing an output of the trained first inverse ARX linear model to the respective second half of the series of OP signal.

The system processor 116 determines that the first set of parameters are validated when a first difference between an absolute value of the output of the trained first inverse ARX linear model and an absolute value of the respective second half of the series of controller output signals is less than or equal to a validation threshold. The system processor 116 determines that the trained first inverse ARX linear model having the first set of parameters is unstable when the absolute value of the output of the trained first inverse ARX linear model and the absolute value of the respective second half of the series of controller output signals is greater than the validation threshold. The system processor 116 selects a second inverse ARX linear model which includes a FIR model. The system processor 116 trains the second inverse ARX linear model on the model training dataset to estimate a set of filter weights. The system processor 116 validates the set of filter weights by applying the trained second inverse ARX linear model to the second half of the series of process variable signals of the model validation dataset and comparing an output of the trained second inverse ARX linear model to the respective second half of the OP. The system processor 116 determines that the filter weights are validated when a first difference between an absolute value of the output of the trained second inverse ARX linear model and an absolute value of the respective second half of the series of controller output signals is less than or equal to the validation threshold. The system processor 116 estimates the $\widehat{MV}$, from a linear part of the output of the trained second inverse ARX linear model. The system processor 116 analyzes the series of OP signals, and the estimated $\widehat{MV}$, to determine stick values, S, and jump values, J, in the valve operation during each sampling interval.

When the first difference is greater than the validation threshold, the system processor 116 determines iteratively incrementing the first set of parameters and reapplying the trained first inverse ARX linear model having the incremented first set of parameters to the first half of the series of process variable signals of the model training dataset, until a second difference between the absolute value of the output of the trained first inverse ARX linear model having the incremented first set of parameters and the absolute value of the respective second half of the series of controller output signals is less than or equal to the validation threshold, where the second difference is less than the first difference.

The system processor 116 determines that the trained first inverse ARX linear model having the first set of parameters is unstable when the absolute value of the output of the trained first inverse ARX linear model and the absolute value of the respective second half of the series of controller output signals is greater than the validation threshold. The system processor 116 trains an inverse non-linear auto regressive exogenous, NLARX, model by performing inverse modelling on the first half of the series of process variable signals of the model training dataset, comparing the respective first half of the series of controller output signals to the output of the inverse NLARX model, and estimates a second set of parameters of the inverse NLARX model. The system processor 116 validates the second set of parameters by applying the trained inverse NLARX model to the second half of the series of process variable signals of the model validation dataset and comparing an output of the trained inverse NLARX model to the respective second half of the series of OP signals. The system processor 116 determines that the second set of parameters is validated when a third difference between an absolute value of the output of the trained inverse NLARX model and an absolute value of the respective second half of the series of OP signals, is less than or equal to the validation threshold. When the third difference is greater than the validation threshold, The system processor 116 iteratively increments the second set of parameters and reapplies the trained inverse NLARX model having the incremented second set of parameters to the first half of the series of process variable signals of the model training dataset, until a fourth difference between the absolute value of the output of the trained inverse NLARX model having the incremented second set of parameters and the absolute value of the respective second half of the series of OP signals, is less than or equal to the validation threshold, where the fourth difference is less than the third difference.

The system processor 116 compares the second difference of the trained inverse ARX linear model to the fourth difference of the trained inverse NLARX model. The system processor 116 determines the valve operation is linear when the second difference is less than the fourth difference. The system processor 116 determines the valve operation is non-linear when the second difference is greater than the fourth difference. The system processor 116 estimates the manipulated variable, $\widehat{MV}$ by one of the following:

i) when the first difference is less than or equal to the validation threshold, the system processor 116 estimates the manipulated variable, $\widehat{MV}$, from the output clusters of the trained inverse ARX linear model having the first set of parameters;

ii) when the first difference is greater than the validation threshold and the second difference is less than or equal to the validation threshold, the system processor 116 estimates the manipulated variable, $\widehat{MV}$, from the output of the trained first inverse ARX linear model having the incremented first set of parameters;

iii) when the third difference is less than or equal to the validation threshold, and the third difference is less than or equal to the second difference, the system processor 116 estimates the manipulated variable, $\widehat{MV}$, from a linear part of the output of the trained inverse NLARX model having the second set of parameters; and iv) when the third difference is greater than the validation threshold and the fourth difference is less than or equal to the validation threshold and less than the second difference, the system processor 116 estimates the manipulated variable, $\widehat{MV}$, from a linear part of the output of the trained inverse NLARX model having the incremented second set of parameters.

When the first difference is less than or equal to the validation threshold, or when the first difference is greater than the validation threshold and the second difference is less than or equal to the validation threshold, the system processor 116 determines estimates the stick values, S, and jump values, J, in the valve operation from the series of setpoint signals, SP, and the series of controller output signals, OP. When the third difference is less than or equal to the validation threshold, and the third difference is less than or equal to the second difference, or the third difference is greater than the validation threshold and the fourth difference is less than or equal to the validation threshold and less than the second difference, the system processor 116 estimates the stick values, S, and jump values, J, in the valve operation from the series of controller output signals, OP, and the estimated manipulated variable, $\widehat{MV}$.

The system processor 116 converts the PV, for each sampling interval, to a process variable percentage by calculating a difference between a maximum process variable and a minimum process variable, and dividing the difference by a sum of the process variables in each sampling interval. The system processor 116 converts the converting the OP variables, for each sampling interval, to a controller output variable percentage by calculating a difference between a maximum controller output variable and a minimum controller output variable, and dividing the difference by a sum of the controller output variables in each sampling interval. The PV is converted to percent value based on the maximum and minimum range to get the PV or the OP into to a same range an estimated valve output. The inverse modelling is described in simplified form in FIG. 3B.

Figure 2:
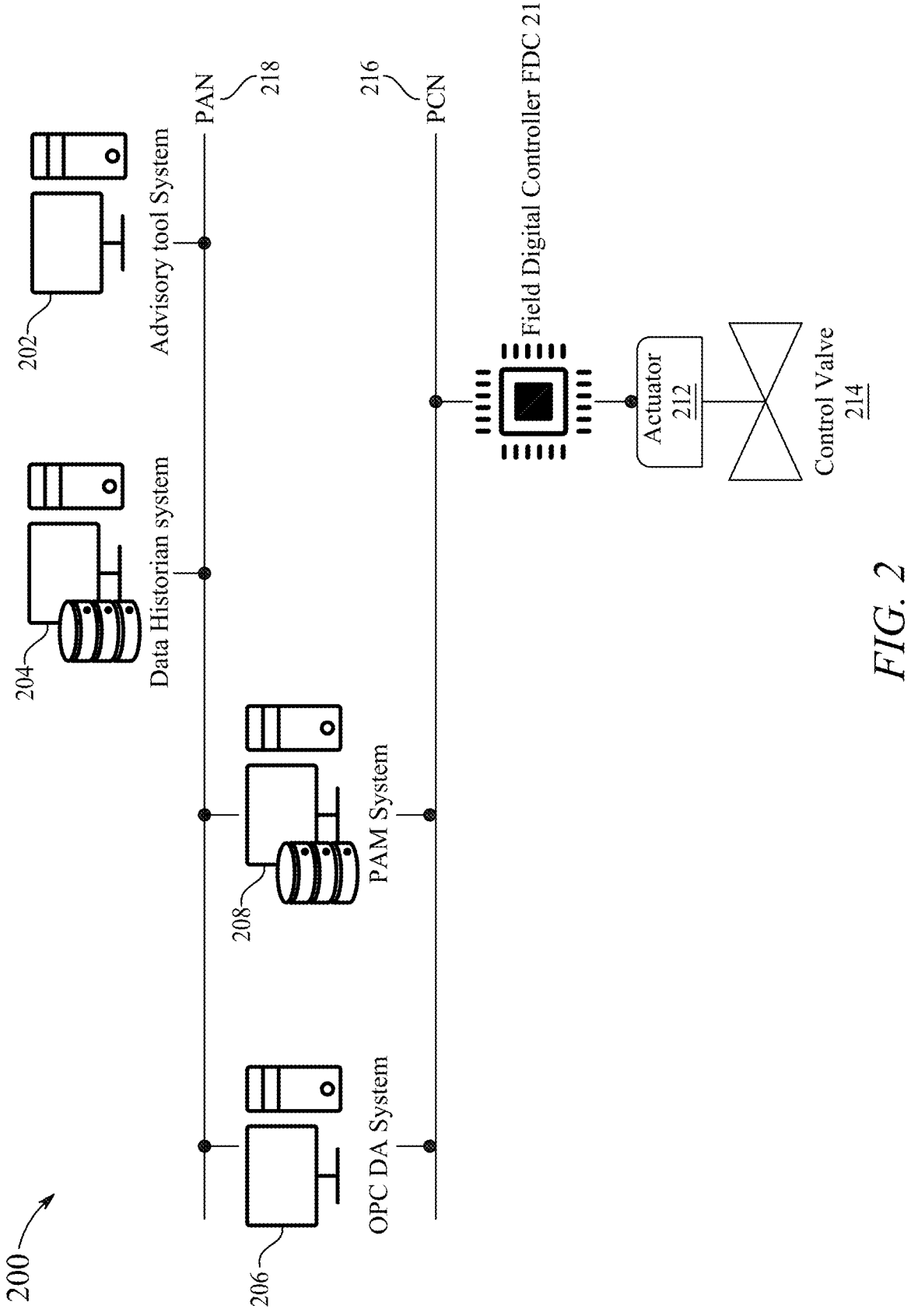
FIG. 2 depicts the network architecture of a system for controlling a pneumatically controlled valve, according to exemplary aspects of the present disclosure.

FIG. 2 depicts the network architecture of a system 200 for controlling a pneumatically controlled valve, according to exemplary aspects of the present disclosure.

The system 200 may include an advisory tool system 202, a data historian system 204, open platform communications (OPC) data access (DA) system 206, plant asset management (PAM) system 208, a field digital controller (FDC) 210, an actuator 212, a (conventional) control valve 214, a plant control network (PCN) 216, and a plant automation network (PAN) 218. The actuator 212 pneumatically controls the control valve 214 based on control signals received from the FDC 210. The advisory tool system 202 may be implemented by the system processor 116. Although FIG. 2 illustrates system 200 including a single actuator 212 and corresponding control valve 214, the system 200 may include a plurality of control valves and corresponding actuators.

The advisory tool system 202 may access various types of data to detect a non-linear dynamic of the actuator 212. The non-linear dynamic of the actuator 212 may be caused by stiction, which may also cause a stick and jump valve behavior of the control valve 214. The advisory tool system 202 may quantify the stiction. The advisory tool system 202 may determine a level or severity of stiction based on predetermined thresholds levels. The advisory tool system 202 may propose an appropriate compensation method to compensate for the stiction. The advisory tool system 202 may provide an intuitive user interface for data visualization for display on the display 120 and/or operator workstation 110. The data historian system 204 may collect production and process data from across the plant and store the data in a time series database.

The OPCDA system 206 provides access to real-time data from various field instruments, such as control valves, actuators, sensors, programmable logic controllers, etc., across the plant. OPCDA refers to a group of client-server standards that provides specifications for communicating the real-time data from various data acquisition devices across the plant such as program Mable logic controllers (PLCs) to display and interface devices, such as Human-Machine Interfaces (HMI) and SCADA systems.

The PAM system 208 may provide data such as operating parameters and technical specifications associated with various field instruments, such as control valves, actuators, sensors, programmable logic controllers, etc., that are part of the plant.

The FDC 210 may generate the control signal (i.e., the controller output (OP)) for the actuator 212 to pneumatically actuate the control valve 214. The FDC 210 may include I/O ports interface. The I/O ports interface may be connected to the PCN 216 to exchange data with the OPC DA system 206, the data historian system 204, and the advisory tool system 202. The I/O ports interface may be connected to various field instruments in the plant, such as the control valve (104, 214), the actuator (106, 212), the sensor 108, the pneumatic supplier 112, the electrical-to-pressure converter 114 and the system processor 116, using various industrial automation communication protocols, such as Highway Addressable Remote Transducer (HART) communication protocol and/or Fieldbus protocols standardized as IEC 61158. The FDC 210 may include one or more processors, memory devices, and communication interfaces. The communication interfaces may send and/or receive signals that carry digital data streams representing various types of information, such as the OP, the PV, the MV, and the SP. FDC 210 may be programmed to function as, for example, a linear PID controller and a FIR filter, and perform a tuning algorithm to optimize parameters of the FIR model used for compensating for the non-linear dynamic motion of the actuator (106, FIG. 1 or 212, FIG. 2).

The PCN 216 provides a communication link between the FDC 210, the OPC DA system 206, and the PAM system 208.

The PAN 218 provides a communication link between the OPC DA system 206, the PAM system 208, the data historian system 204, and the advisory tool system 202.

Figure 3A:
FIG. 3A depicts a schematic diagram of an advisory tool system, according to exemplary aspects of the present disclosure.
Figure 3A:
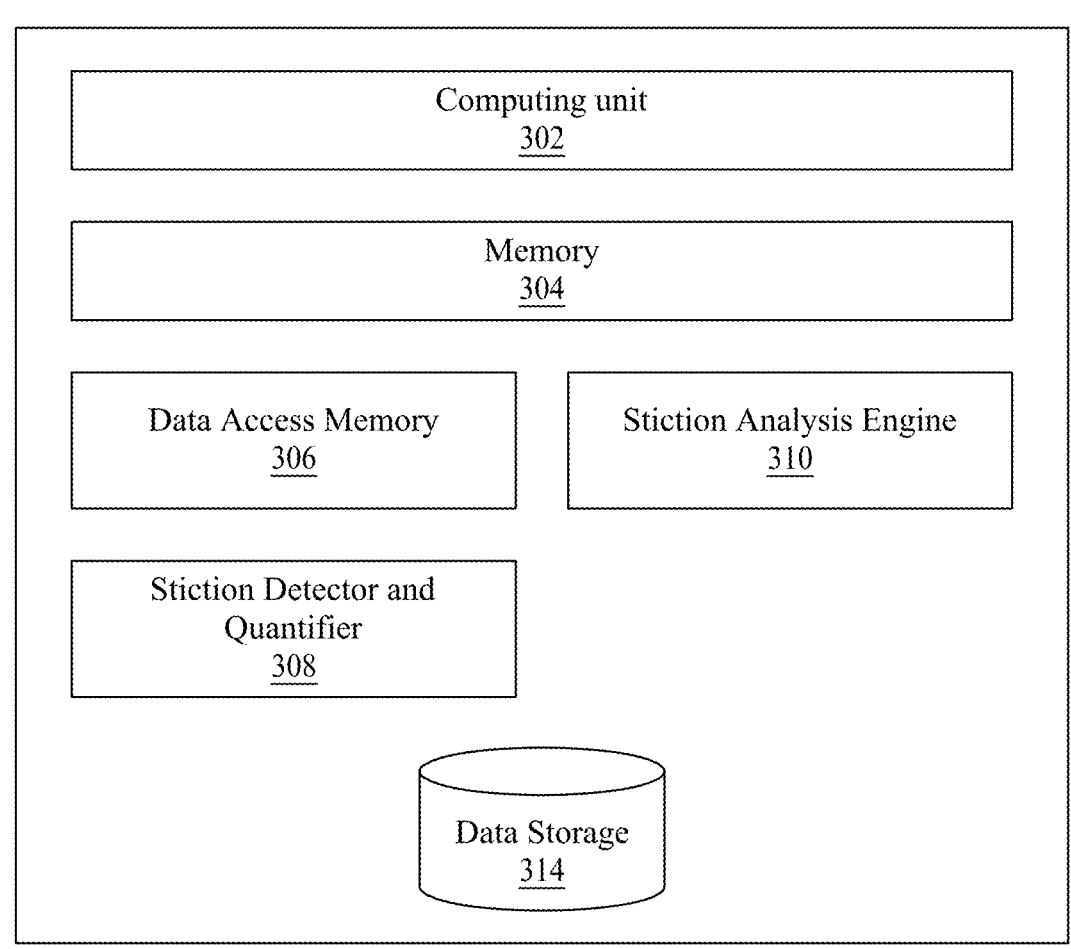

FIG. 3A depicts a schematic diagram 300A of the advisory tool system 202, according to exemplary aspects of the present disclosure.

The advisory tool system 202 may include a computing unit 302 and a memory 304. The computing unit 302 may be implemented as one or more microprocessors, microcomputers, microcontrollers, digital signal processors, central processing units, graphical processing units, state machines, logic circuitries, and/or any devices that manipulate signals based on operational instructions. Among other capabilities, the computing unit 302 may be configured to fetch and execute computer-readable instructions stored in the memory 304. In some examples, the memory 304 may include any computer-readable medium known in the art including, for example, volatile memory, such as static random access memory (SRAM) and dynamic random access memory (DRAM) and/or nonvolatile memory, such as read only memory (ROM), erasable programmable ROM, flash memories, hard disks, optical disks, and magnetic tapes. In some examples, the computing unit 302 may be the stiction processor 118. The memory 304 may be capable of storing data and allowing any storage location to be directly accessed by the computing unit 302.

The advisory tool system 202 may also include a data access memory 306, a stiction detector and quantifier 308, a stiction analysis engine 310, and a data storage 314.

The data access memory 306 may access real-time data, such as the PV (flow information or level information), the $\widehat{MV}$, the SP, and the OP. In some examples, the advisory tool system 202 may directly access the real-time data from various field instruments across the plant using various communication protocols. In a non-limiting example, the communication protocol may be a HART™ communication protocol. The HART™ Protocol is a global standard for sending and receiving digital information across analog wires between smart devices and control or monitoring systems. In another non-limiting example, the communication protocol may be a Foundation Fieldbus™, which is an all-digital, serial, two-way communications system that serves as the base-level network in a plant or factory automation environment. It is targeted for applications using basic and advanced regulatory control, and for much of the discrete control associated with those functions.

The data access memory 306 may access the real-time data using the OPCDA system 206. The data access memory 306 may access archived or historical data from the data historian system 204. In some examples, the data access memory 306 may access data stored in relational database management system using Structured Query Language (SQL) or directly access data stored in various file formats, such as MS Excel® Workbook (.xlsx) file format, comma-separated values (.csv) file format, and text (.txt) file format. The data access memory 306 may access field digital data from the PAM system 208. The advisory tool system 202 may be integrated into one or more field instruments to directly access real-time data associated with the field instruments.

The stiction detector and quantifier 308 may detect the non-linear dynamic of the actuator (106, 212) caused by static friction (stiction), which may also cause a stick (S) and jump (J) valve behavior of the control valve (104, 214). The stiction detector and quantifier 308 may receive, via the data access memory 306, a current segment of data signals from one or more process measurement devices connected to the control valve 214. The current segment of data signals may include one or more of the PV and the OP. The one or more process measurement devices may correspond to various field instruments, such as the sensor 108 and the controller 102. In some examples, the stiction detector and quantifier 308 may receive a historic segment of data signals via the data access memory 306. The historic segment of data signals may be stored in the data historian system 204. The historic segment of data signals may correspond to value of data signals recorded by the one or more process measurement devices in the past. The historic segment of data signals may correspond to a value of data signals that are desired or considered ideal for the operation of the pneumatically controlled valve system 100, and may be used to identify potential setpoint (SP) values. For example, the historic segment of data signals may correspond to previously recorded values of process measurements, such as the PV, the OP and the $\widehat{MV}$, which are considered as a reference for the operation of the pneumatically controlled valve system 100.

The stiction detector and quantifier 308 may quantify the stiction by determining the severity of stiction. In some examples, the severity of stiction may be represented using multiple levels, for example, low, moderate, and high. If i) the amount or magnitude of stiction is less than or equal to the values of S or J estimated by the stiction model, the severity of stiction may be determined as low, ii) if the amount or magnitude of stiction is greater than the value of S and less than the value of J (or the converse), the severity of stiction may be determined as moderate, and iii) if the amount or magnitude of variation is greater than the values of S and J, the severity of stiction may be determined as high.

The stiction compensator (not shown) may determine an appropriate compensation method to compensate for the stiction of the actuator (106, 212). The stiction compensator may generate instructions for the FDC 210 to generate control signals to be applied to the actuator (106, 212) to compensate for the stiction.

The stiction compensator may use several methods to compensate for the stiction. The stiction compensator may directly provide instructions to the FDC 210 to implement a suitable compensation technique or recommend a suitable compensation technique to the operator. To compensate for the stiction, the stiction compensator may use various compensation techniques such as i) linear compensation, ii) non-linear compensation, iii) PID outer loop compensation, and iv) PID inner loop compensation. The above techniques are not described herein as they are described in the priority application which is incorporated herein by entirety.

The advisory tool may include stiction analysis engine 310. The stiction analysis engine 310 obtains the manipulated variable, $\widehat{MV}$ determined by the system processor 116 using the inverse modeling. The stiction analysis engine 310 provides the $\widehat{MV}$ to the advisory tool system 202 and/or the data access memory 306 for processing including display or sharing with other components. The inverse modelling is described in simplified form in FIG. 3B.

Figure 3B:
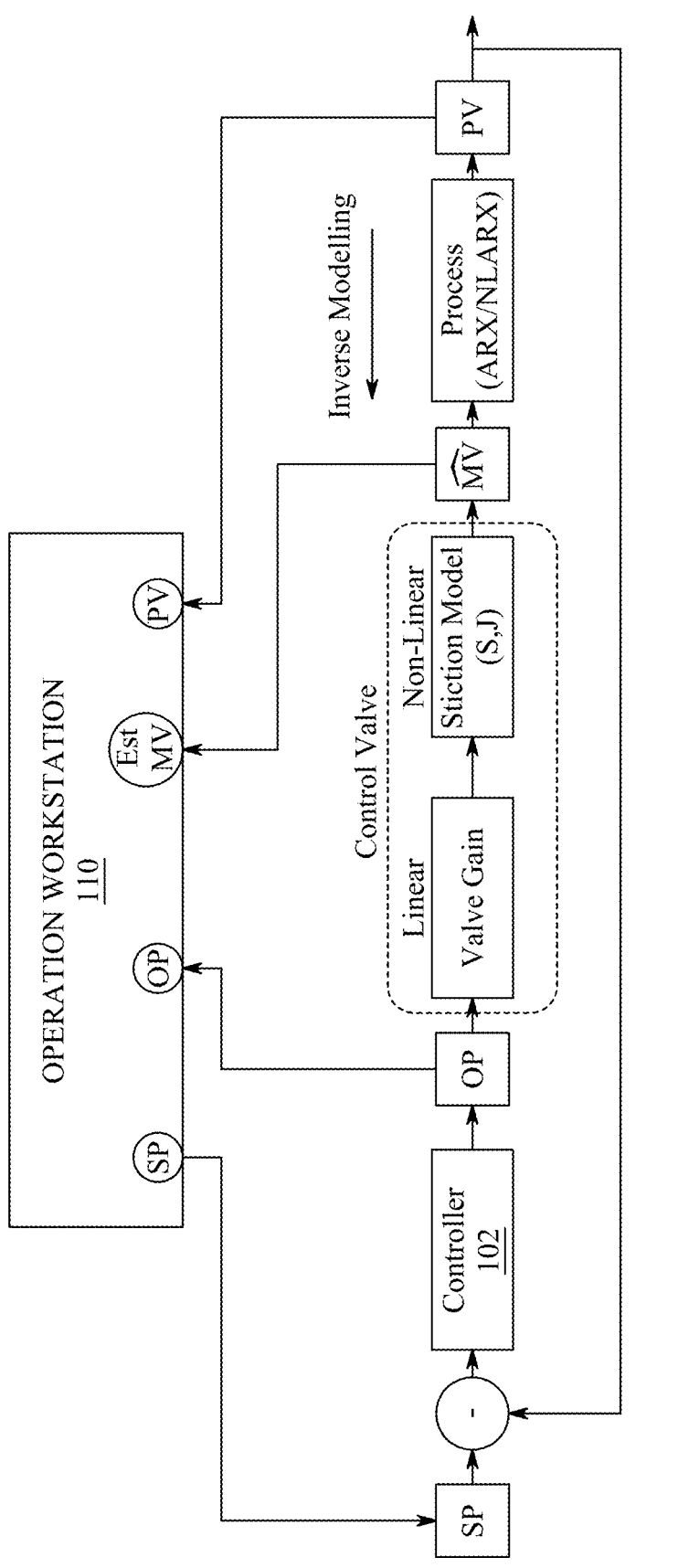
FIG. 3B illustrates an illustrative process demonstrating an inverse modelling, according to exemplary aspects of the present disclosure.

FIG. 3B illustrates an illustrative process for obtaining the manipulated variable $\widehat{MV}$, according to an example embodiment. FIG. 3B illustrates the system 100 of FIG. 1 from a perspective of a process of the inverse modelling. In FIG. 3B, the SP may be received by the controller. The controller 102 generates the OP. The OP is applied to the control valve 104 through the actuator 106. In an example, the valve operation may be identified as a linear process based on valve gain. In some examples, the valve operation may be identified as non-linear, in which case, a stiction model for analysis stiction as described above is applied. The PV is measured downstream of the control valve 104. An inverse modelling is performed on the PV using ARX/NLARX as described in FIG. 3A to estimate $\widehat{MV}$. The OP, the $\widehat{MV}$, the PV are displayed in the operator workstation 110 and/or the display 120.

Figure 4:
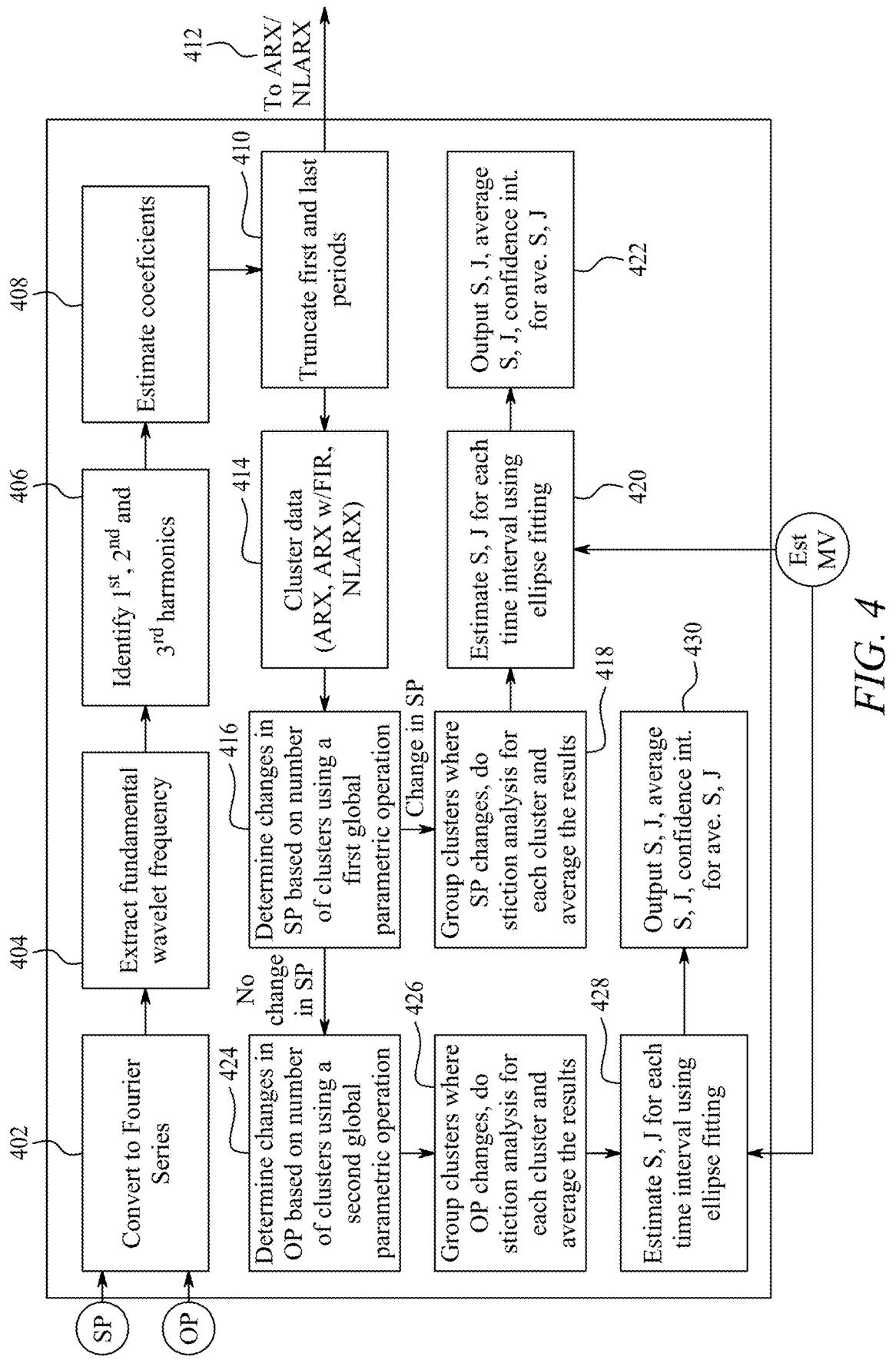
FIG. 4 depicts a process for stiction analysis of a valve operation in a fluid process plant, according to exemplary aspects of the present disclosure.

FIG. 4 depicts a process for stiction analysis of a valve operation in a fluid process plant, according to exemplary aspects of the present disclosure. Step 402 includes the system processor 116 applying a Fourier transform on each of the SP and the OP. In examples, Fourier series may represent a signal by a weighted summation of sines and cosines. Each term in the summation has a weight that is its amplitude and a frequency that is multiple of a particular fundamental frequency (Equation 1).

$$f(x) = \Sigma_{k=0}^{\infty} a_k \cos(k \, w_0 \, t) + b_k \sin(k \, w_0 \, t), \qquad (1)$$

where $w_0$ is called the fundamental frequency. Each term is called a frequency component and $a_k$ and $b_k$ represent contribution of that frequency in the signal. In other words, $a_k$ and $b_k$ indicate significance of each component in reconstructing the signal. If $a_k$ or $b_k$ for a particular k is negligible (zero or very small compared to the others), the contribution of that component is truncated. Referring back to step 402, in examples, application of the Fourier transform includes generating a first Fourier series by performing a first Fourier transform on each of SP, and a second Fourier series by performing a second Fourier transform on each of the OP. Step 404 includes the system processor 116 extracting a fundamental wavelet frequency. In examples, the extraction includes extracting a first fundamental wavelet frequency from the first Fourier series, and a second fundamental wavelet frequency from the second Fourier series. In some examples, the system processor 116 uses a bootstrap identification technique to determine $w_0$ and the amplitudes $a_k$ and $b_k$. The bootstrap identification technique works by alternating between identifying $w_0$ for a particular set of $a_k$ and $b_k$. Once $w_0$ is determined, data becomes linear in parameter, and the system processor 116 performs the identification of $a_k$ and $b_k$. The system processor 116 performs identification for a maximum number of iterations or when a certain error between the Fourier series and the original signal is achieved. In the disclosure, the system processor 116 is configured to consider the first three harmonics of the fundamental wavelet frequency. The third harmonic frequency which is $3w_0$ is used. A corresponding associated time period $2\pi/(3w_0)$ is removed from the beginning and from the end of the considered signal. This allows to remove possible incorrect data from the beginning and from the end of the recorded signal.

Step 406 includes the system processor 116 identifying a first, second and third harmonic of the fundamental wavelet frequency. In examples, the identification includes identifying a first, second and third harmonic of the first fundamental wavelet frequency, and identifying a first, second and third harmonic of the second fundamental wavelet frequency. Step 408 includes estimating Fourier coefficients by the system processor 116. In examples, the estimation includes estimating, for each of the first, second and third harmonics of the first fundamental wavelet frequency, a first Fourier coefficient and a second Fourier coefficient, respectively. The estimation also includes estimating, for each of the first, second and third harmonics of the second fundamental wavelet frequency, a third Fourier coefficient and a fourth Fourier coefficient, respectively. Step 410 includes the system processor 116 generating a setpoint dataset by truncating a first period and a last period of the first Fourier series. Step 412 includes the system processor 116 generating a controller output dataset by truncating a first period and a last period of the second Fourier series. The third harmonic frequency, which is $3w_0$, is used, and the system processor 116 removes the corresponding associated time period $2\pi/(3w_0)$ from the beginning and from the end of the considered fundamental wavelet frequency. In examples, the truncation is performed to eliminate outliers that may be present at a start of data recording and at an end of data recording. In some examples, the system processor 116 may use the OP from the controller 102 to perform the truncation.

Step 414 includes the system processor 116 clustering the setpoint dataset to generate a plurality of setpoint clusters. In some examples, the clustering is performed for detecting the maximum number of segments from the setpoint dataset. In examples, the system processor 116 may input the setpoint dataset to, for example, trained classifiers. The trained classifiers may use smart data clustering techniques such as Kmeans and DBscan to determine the number of clusters that exists due to variable either the SP, or the OP. In the Kmeans technique, the classifier clusters setpoint data, and measures a squared distance of new data from each cluster to determine which cluster it should belong to. In example, the classifier may use distance metric and cityblock functional (Equation 2) as criteria. Distance may be computed as provide in below.

$$d(x,c) = \Sigma_{j=1}^{P} |x_j - C_j|, \qquad (2)$$

where p and $C_j$ are the size of the data vector and data centroid, respectively. Setpoint data within a certain distance are considered part of a same segment. The DBscan (Density-based spatial clustering of applications with noise) technique involves a density-based clustering non-parametric algorithm. For a given setpoint dataset in some space, the DBscan technique may group together points that are closely packed together (points with many nearby neighbors), marking as outliers points that lie alone in low-density regions (whose nearest neighbors are too far away). The system processor 116 ellipse fits each setpoint cluster to determine a number of setpoint changes in each sampling interval of the setpoint cluster. The ellipse fitting is performed after clustering due to the possibility that the number of data points in a cluster may not be large enough to use in performing accurate stiction analysis. Therefore, ellipse fitting determines if the number of data points is great enough to form an ellipse. If this condition is not satisfied, then the data is appended it to a next data interval to have enough data for stiction analysis. Ellipse fitting is known in art and thus is not explained in detail. The system processor 116 compares the number of setpoint changes to a first threshold, wherein the first threshold is greater than zero. When the number of setpoint changes is less than the first threshold, the system processor 116 adds the sampling interval to a next sampling interval of the setpoint data points. When the number of setpoint data points is zero for each sampling interval, the system processor 116 clusters the controller output dataset to generate a plurality of controller output clusters. The system processor 116 performs ellipse fitting for each controller output cluster to determine a number of controller output data points in each sampling interval of the controller output cluster. The system processor 116 compares the number of controller output data points to a second threshold, and when the number of controller output data points is less than the second threshold, the system processor 116 adds the sampling interval to a next sampling interval of the controller output data points. In some examples, the system processor 116 ellipse fits each setpoint cluster to determine a number of setpoint changes in each sampling interval of the setpoint cluster. The system processor 116 then compares the number of setpoint changes to a first threshold. The first threshold set is greater than zero. In examples, when the number of setpoint changes is less than the first threshold, the sampling interval is added to a next sampling interval of the setpoint data points. The step 414 further includes when the number of setpoint data points is zero for each sampling interval, the system processor 116 clusters the controller output dataset to generate a plurality of controller output clusters. The system processor 116 ellipse fits each controller output cluster to determine a number of controller output data points in each sampling interval of the controller output cluster. In some examples, the system processor 116 compares the number of controller output data points to a second threshold. When the number of controller output data points is less than the second threshold, the system processor 116 adds the sampling interval to a next sampling interval of the controller output data points.

Step 416 includes the system processor 116 clustering the setpoint dataset for each sampling interval, to generate a plurality of setpoint clusters and applying a first global parametric operation to the plurality of setpoint clusters to determine in which setpoint clusters the setpoint changes. The global parametric operation involves selecting a signal and further selecting a point in the signal and dividing the signal into two sections. In the next step, the global parametric operation computes an empirical estimate of a desired statistical property for each section. At each point within a section, the global parametric operation measures the deviation of the property from the empirical estimate. Further, the global parametric operation adds the deviations for all points. Then, the global parametric operation adds the deviations section-to-section to find the total residual error. The global parametric operation varies the location of the division point until the total residual error attains a minimum. Referring back to clustering, in some examples, the clustering is performed by the trained classifiers as described above. The number of clusters represents the maximum number of changes based on data analytics. The system processor 116 may use the number in the first and/or second parametric global operations to detect time of change to find the time instant where the SP changed, and determines the intervals where either a root mean square (RMS) or the variance of the setpoint dataset does not change. In examples, the system processor 116 performs the first global parametric operation by detecting a time instant in each of the set point clusters in which an amplitude of the setpoint changes, and determining each time interval when one of a root-mean-square difference does not change and a variance of the set point clusters does not change. When there are setpoint changes in the setpoint clusters, the system processor 116, in step 418 performs grouping the setpoint clusters to form setpoint cluster groups in which the setpoint changes and performing stiction analysis on each setpoint cluster group in which the setpoint changes and average results of the analysis. In examples, the system processor 116 performs the stiction analysis to determine stick, S, values and jump, J, values of each setpoint cluster group. The system processor 116 removes outlying S values and outlying J values by ellipse fitting each setpoint cluster group for each sampling interval to generate cleaned setpoint cluster groups. The system processor 116 averages the S values of the cleaned setpoint cluster groups in each sampling interval to generate an average S value for each sampling interval, and averages the J values of the cleaned setpoint cluster groups in each sampling interval to generate an average J value for each sampling interval. Step 420 includes receiving the $\widehat{MV}$ and estimating the stick value, S and the average J value for each time interval using ellipse fitting. In examples, the system processor 116 performs ellipse fitting on the average S values to generate the estimated stick value, S, of the valve operation for each sampling interval, and ellipse fitting on the average J values to estimate the jump value, J, of the valve operation for each sampling interval. In order, to ensure that the identification of S and J is not stuck in a local minima, the results of the estimation is perturbed and reinjected again for several other searches.

Step 422 includes outputting the S, J, average S, average J and confidence interval for average S, and average J.

When there are no setpoint changes in the setpoint clusters, the system processor 116, in step 424, determines changes in OP based on number of clusters using a second global parametric operation. In examples, the system processor 116 counts the plurality of controller output clusters and applies a second global parametric operation to the plurality of controller output clusters to determine in which of the controller output clusters the controller output changes. In examples, the system processor 116 performs the second global parametric operation by detecting a time instant in each of the controller output clusters in which an amplitude of the controller output changes, and determining each time interval where either a RMS difference does not change and a variance of the set point clusters does not change. If the RMS of SP or OP does not change and the variance of the setpoint clusters does not change, the system processor 116 sets the number of clusters equal to one. The lack of change in RMS of SP or OP occurs when the OP is cycling with constant amplitude around the same average value. The above steps support processing special operational cases in which the setpoint of the control loop changes either continuously or frequently and determines the cycling in the OP. If stiction analysis is made using a complete data set, a value of the estimated stiction may not be accurately estimated. Thus, the data may be divided into segments/clusters based on SP changes or OP changes and then the value of the estimated stiction is calculated for each data segment in which the setpoint does not change as described below. The complete dataset may refer to all the data points that were recorded from the different sensors in the control loop. In a closed loop system, since SP or OP are segmented based on change points, the rest of the data has to be segmented for each same interval. In an example, ithe dataset may include 4000 data points (complete data set) and the SP may changes over time, for example, from 1 s-1000 s, the SP=20, for 1000 s-3000 s, the SP=30, and for 3000 s-4000 s, the SP=50. In such instances, the setpoint data may be divided into three sets (using clustering), and stiction analysis may be performed for each set alone and average of results are taken.

Step 426 includes the system processor 116 grouping the controller output clusters, performing stiction analysis for the controller output clusters and averaging results from the analysis. In examples, the system processor 116 groups the controller output clusters to form controller output cluster groups in which the setpoint changes, and performs stiction analysis on each controller output cluster group in which the controller output changes to determine stick, S, values and jump, J, values of each setpoint cluster group. The system processor 116 removes outlying S values and outlying J values by ellipse fitting each controller output cluster group for each sampling interval to generate cleaned controller output cluster groups. The system processor 116 averages the S values of the cleaned controller output cluster groups in each sampling interval to generate an average S value for each sampling interval, and averages the J values the cleaned controller output cluster groups in each sampling interval to generate an average J value for each sampling interval. The above steps may handle a fixed or a variable setpoint, which is the case when the setpoint is calculated by another primary controller or from another control system. Thus, the system processor 116 may be configured to handle cases of nested control loop loops.

Step 428 includes the system processor 116 through the stiction processor 118 estimating stick value, S and the average J values using ellipse fitting and obtaining the $\widehat{MV}$. In examples, the system processor 116 ellipse fits the average S values to generate the estimated stick value, S, of the valve operation for each sampling interval, and ellipse fits the average J values to estimate the jump value, J, of the valve operation for each sampling interval. Step 430 includes outputting the S, J, average S, average J and confidence interval for average S, and average J.

In some examples, an approach to perform stiction analysis may be implemented by dividing the setpoint dataset into equal sampling intervals. The system processor 116 performs the global parametric method to each sampling interval to detect each time instant when an amplitude of the setpoint signals changes and determines each time interval when one of a root-mean-square difference does not change and a variance of the set point signals does not change. The system processor 116 calculates the stick values, S, and jump values, J, from the time instants when the amplitude of the setpoint values changes and one of the RMS difference and the variance does not change, and calculating an average of the stick values, S, and an average of the jump values, J. Due to step performing the global parametric method to each sampling interval, the tool may detect outliers and eliminate the outliers to clean the set of estimated possible stiction and Jump values. In some examples, to process cases with variable setpoints, instead of doing clustering to divide the data, system processor 116 may divide OP and corresponding PV data into uniform segments to minimize transient impact due to setpoint changes into uniform segments, and estimate S and J value for each segment and obtain the average of S and J value. Such process of dividing the setpoint data into uniform segments and estimating S and J value for each segment may be a simpler approach but may not be accurate in comparison with the clustering approach.

Figure 5:
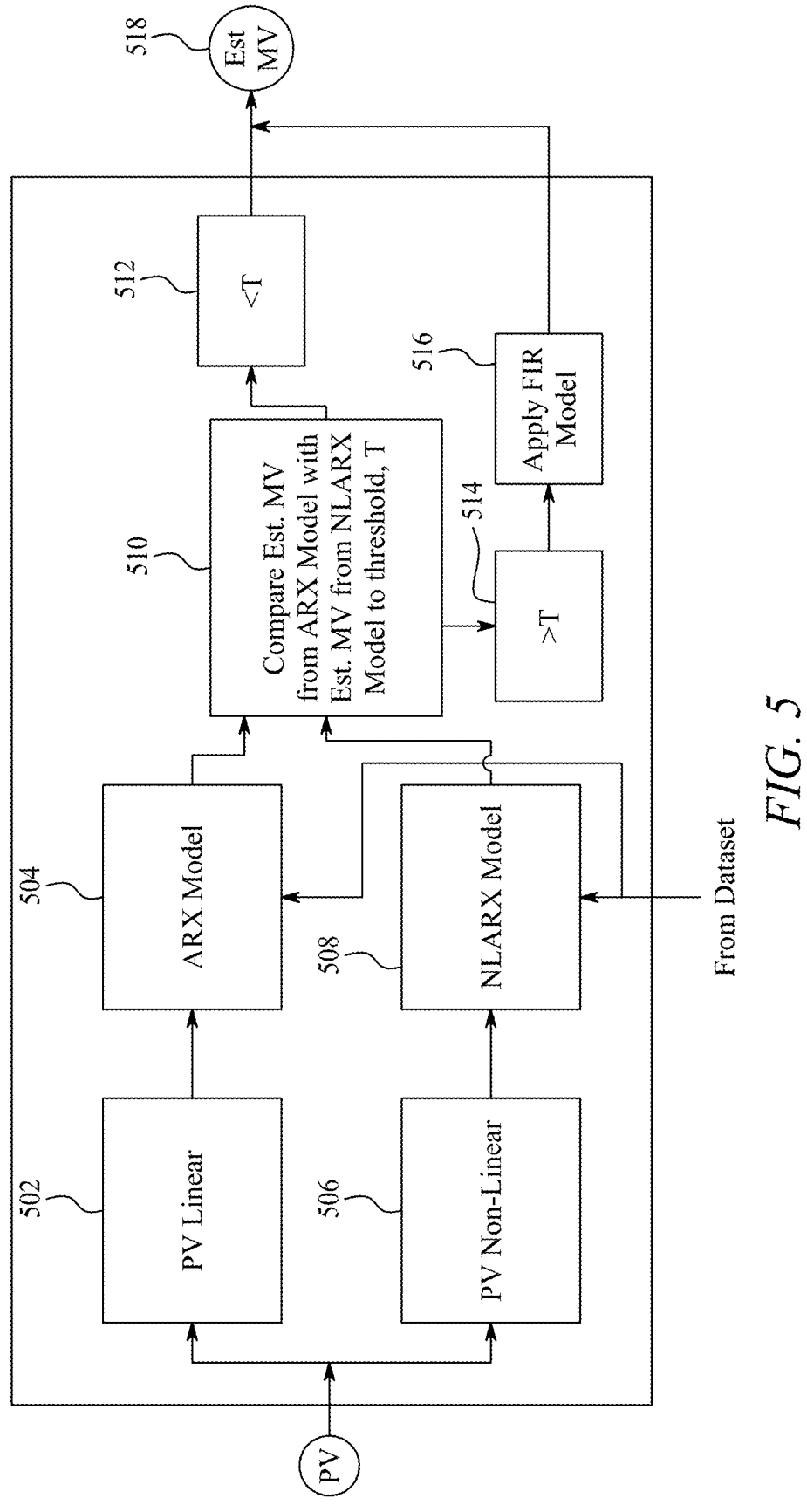
FIG. 5 depicts inverse modelling, according to exemplary aspects of the present disclosure.

FIG. 5 depicts inverse modelling, according to exemplary aspects of the present disclosure. FIG. 5 depicts the inverse modelling which was explained in FIG. 3A in a simplified form. In step 502, based on the PV, the system processor 116 may identify the control valve operation as a linear process. The system processor 116 may form the training model dataset and the validation model dataset. In step 504, the system processor 116 may train a first inverse, ARX linear model and a second inverse, ARX linear model and estimates $\widehat{MV}$ from the ARX model. In step 506, if the system processor 116 determines that the control valve operation as a non-linear process based on determining that trained first inverse ARX linear model having the first set of parameters is unstable when the absolute value of the output of the trained first inverse ARX linear model and the absolute value of the respective second half of the series of controller output signals is greater than the validation threshold, step

508 includes the system processor 116 training an inverse NLARX model by performing inverse modelling on the first half of the PV of the model training dataset to estimate $\widehat{MV}$. In step 510, system processor 116 compares the estimated $\widehat{MV}$ from the ARX linear model with the estimated $\widehat{MV}$ from the NLARX model to threshold T. If the comparison value is less than the threshold T, in step 512, the estimated $\widehat{MV}$ is from ARX linear model is considered in step 518. If the comparison value is greater than the threshold T in step 514, then the FIR model is applied in step 516. The resulting estimated $\widehat{MV}$ is considered in step 518.

Figure 6A:
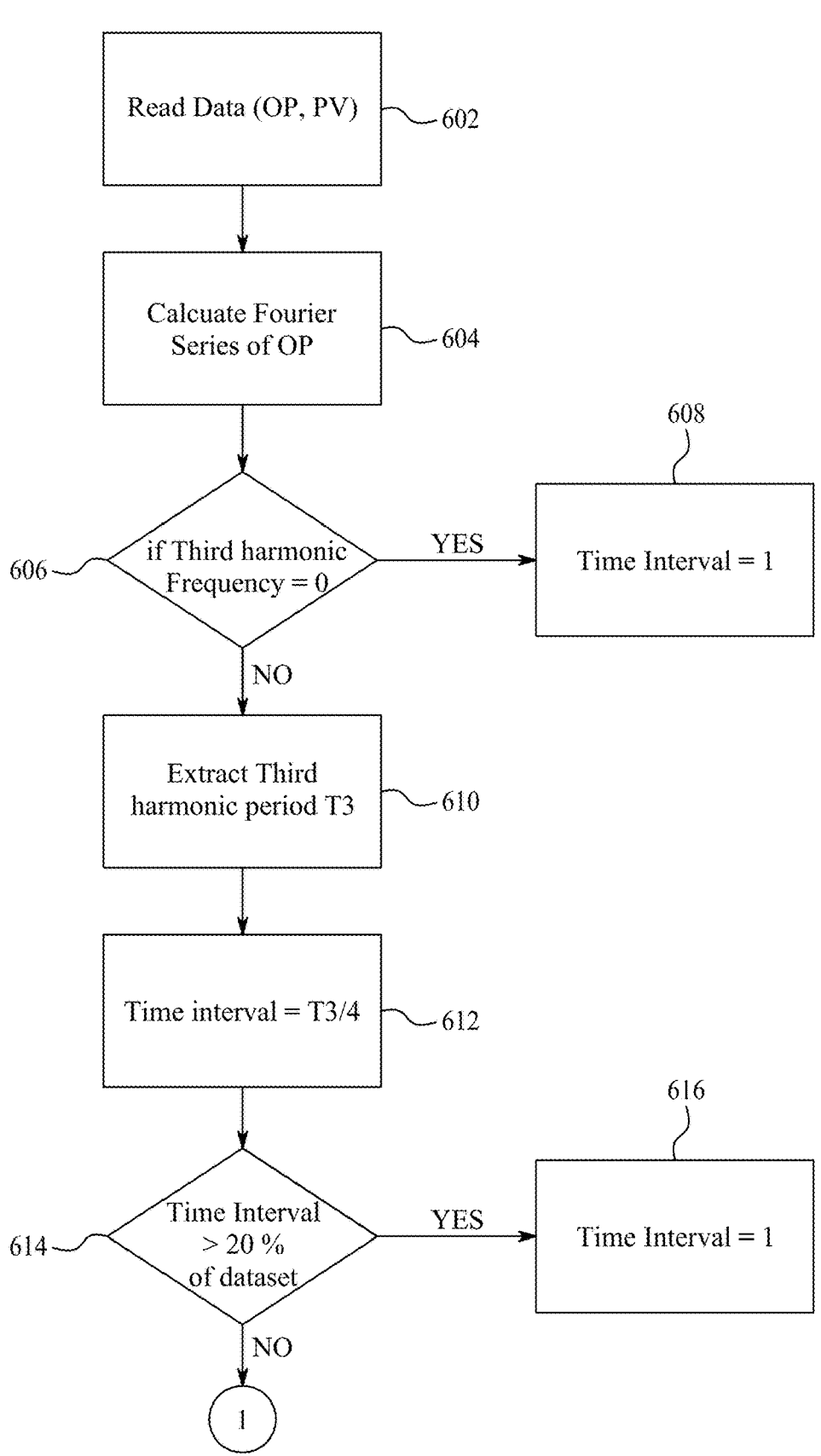
FIG. 6A depicts a flow chart for determining time intervals where a root-mean-square (RMS) or the variance of the setpoint data does not change, according to exemplary aspects of the present disclosure.

FIG. 6A depicts a flow chart for determining time intervals where an RMS or a variance of the setpoint data does not change, according to exemplary aspects of the present disclosure. Step 602 includes reading the OP and the PV. Step 604 includes generating a second Fourier series by performing a second Fourier transform on each of the series of OP. Step 606 includes whether the third harmonic frequency is equal to zero. If the third harmonic frequency is equal to zero, then step 608 includes setting a time interval to 1. If the third harmonic frequency is not equal to zero, then in step 610, a third harmonic period T3 is extracted. Step 612 includes setting the time interval equal to one fourth of the third harmonic period T3/4. Step 614 includes determining if the time interval is greater than 20% of dataset. If the time interval is greater than 20% of dataset, then in step 616 time interval is set to 1.

Figure 6B:
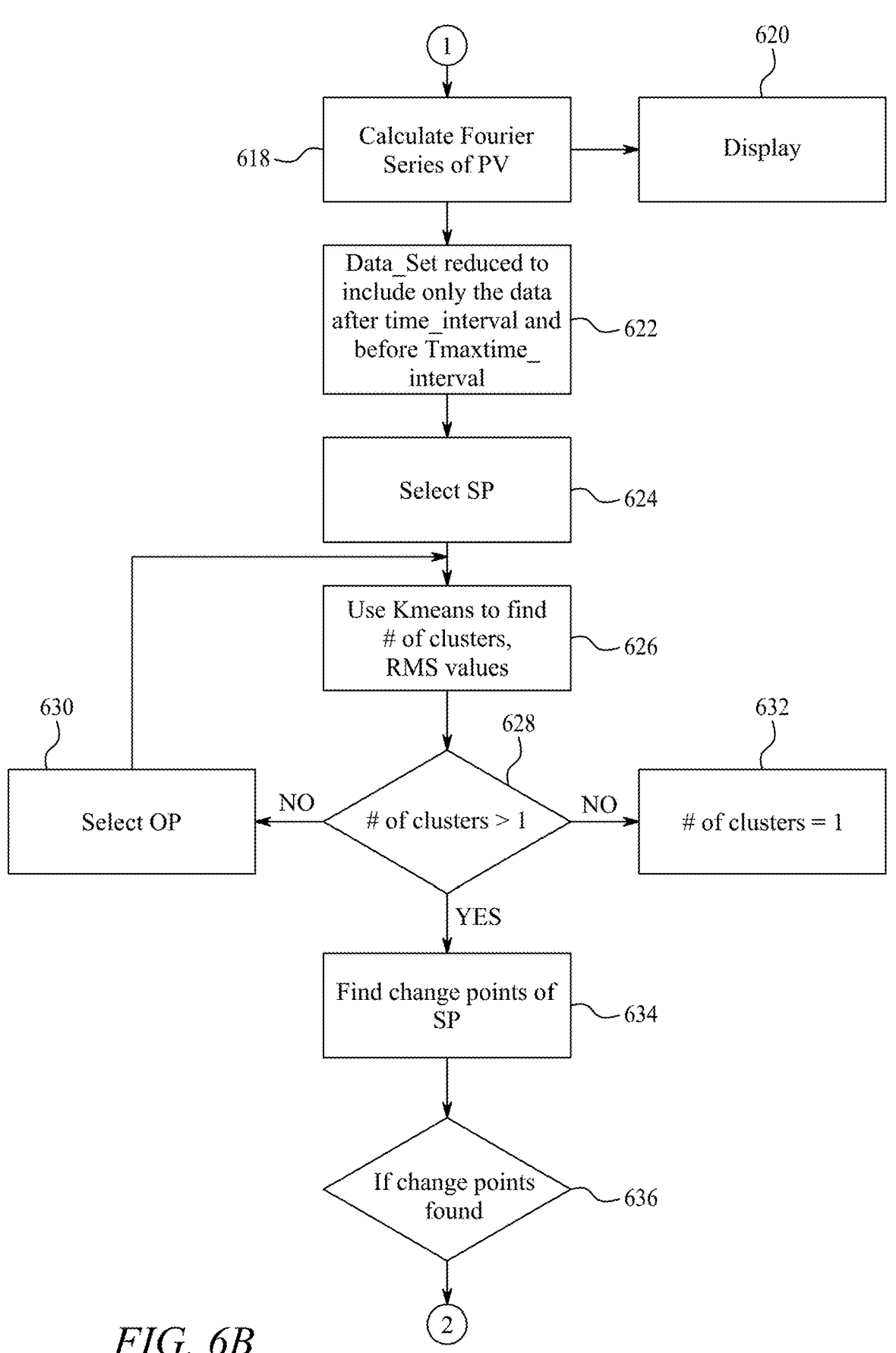
FIG. 6B is a continuation of flow chart of FIG. 6A illustrating additional steps, according to exemplary aspects of the present disclosure.

FIG. 6B is a continuation of flow chart of FIG. 6A illustrating additional steps, according to exemplary aspects of the present disclosure. Continuing from step 614, if the time interval is not greater than 20% of dataset, then in step 618, a Fourier transform is calculated on PV. Step 620, the PV is displayed. Step 622, the data set is reduced to include data after time interval and before Tmaxtime_interval. In step 624, the series of SP is selected. In step 626, the system processor uses Kmeans clustering technique to determine a number of clusters when one of a RMS difference does not change and a variance of the set point signals does not change. Step 628 includes determining whether the number of clusters is greater than 1. If the number of clusters is not greater than 1, then step 630 involves selecting OP and repeating Kmeans clustering technique of step 626, and setting the number of clusters to 1 in step 632. If the number of clusters is greater than 1, step 634 includes finding change points of SP.

Figure 6C:
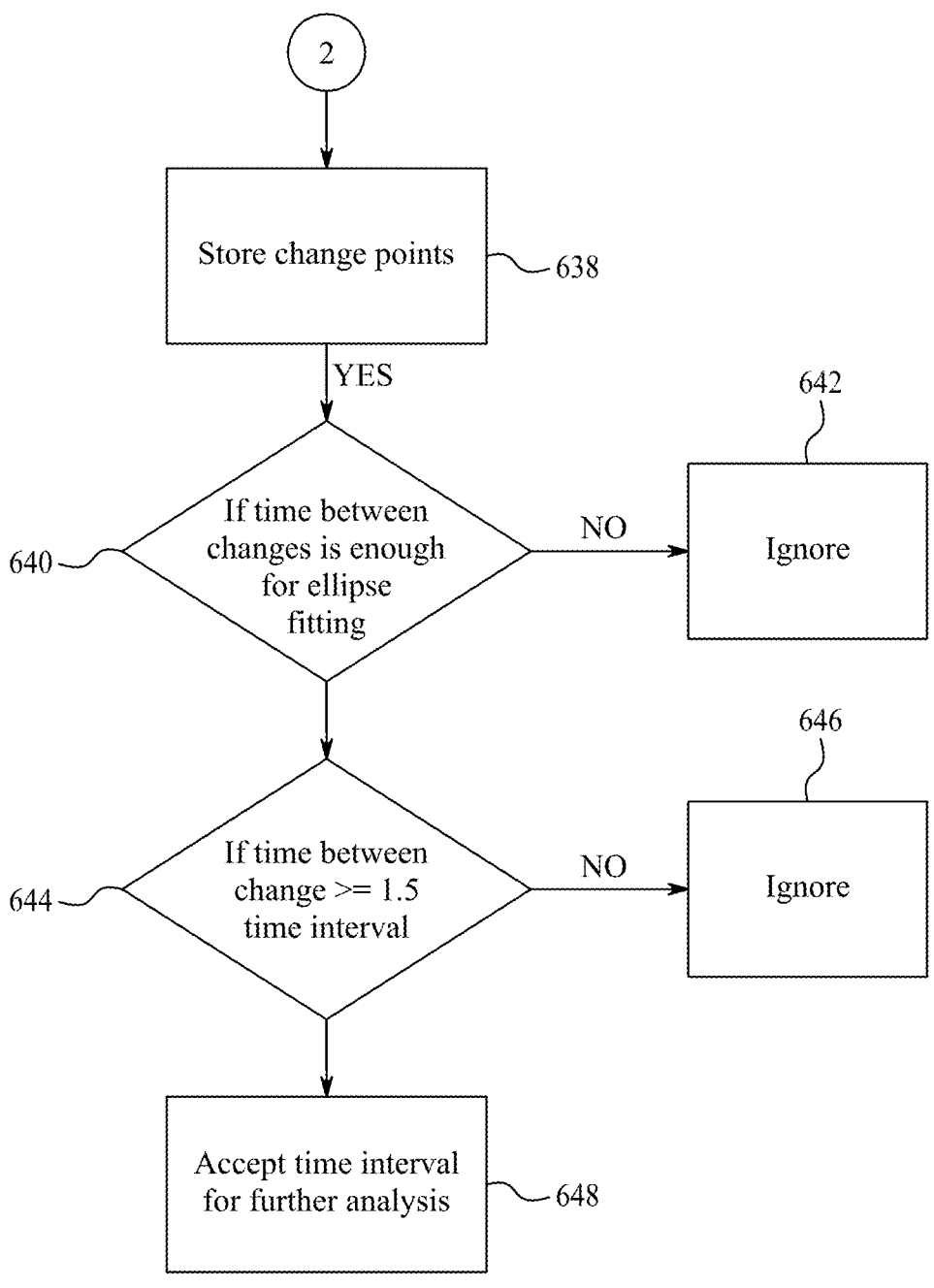
FIG. 6C is a continuation of flow chart of FIG. 6B illustrating additional steps, according to exemplary aspects of the present disclosure.

FIG. 6C is a continuation of flow chart of FIG. 6B illustrating additional steps, according to exemplary aspects of the present disclosure. Step 636 includes determining whether there are any change points found. If there are any change points found, then the change points are stored in step 638. Step 640 includes determining whether the time between change is enough for ellipse fitting. If the time between change is not enough for ellipse fitting, then the time interval is ignored or skipped in step 642. If the time between time between change is not enough for ellipse fitting, then step 644 is performed. Step 644 includes determining whether the time between change is greater than or less than 1.5 time interval. If the time between change is not greater than or less than 1.5 time interval, then the time interval is ignored or skipped in step 646. If the time between change is greater than or less than 1.5 time interval, then time interval is accepted for further analysis in step 648.

Figure 7A:
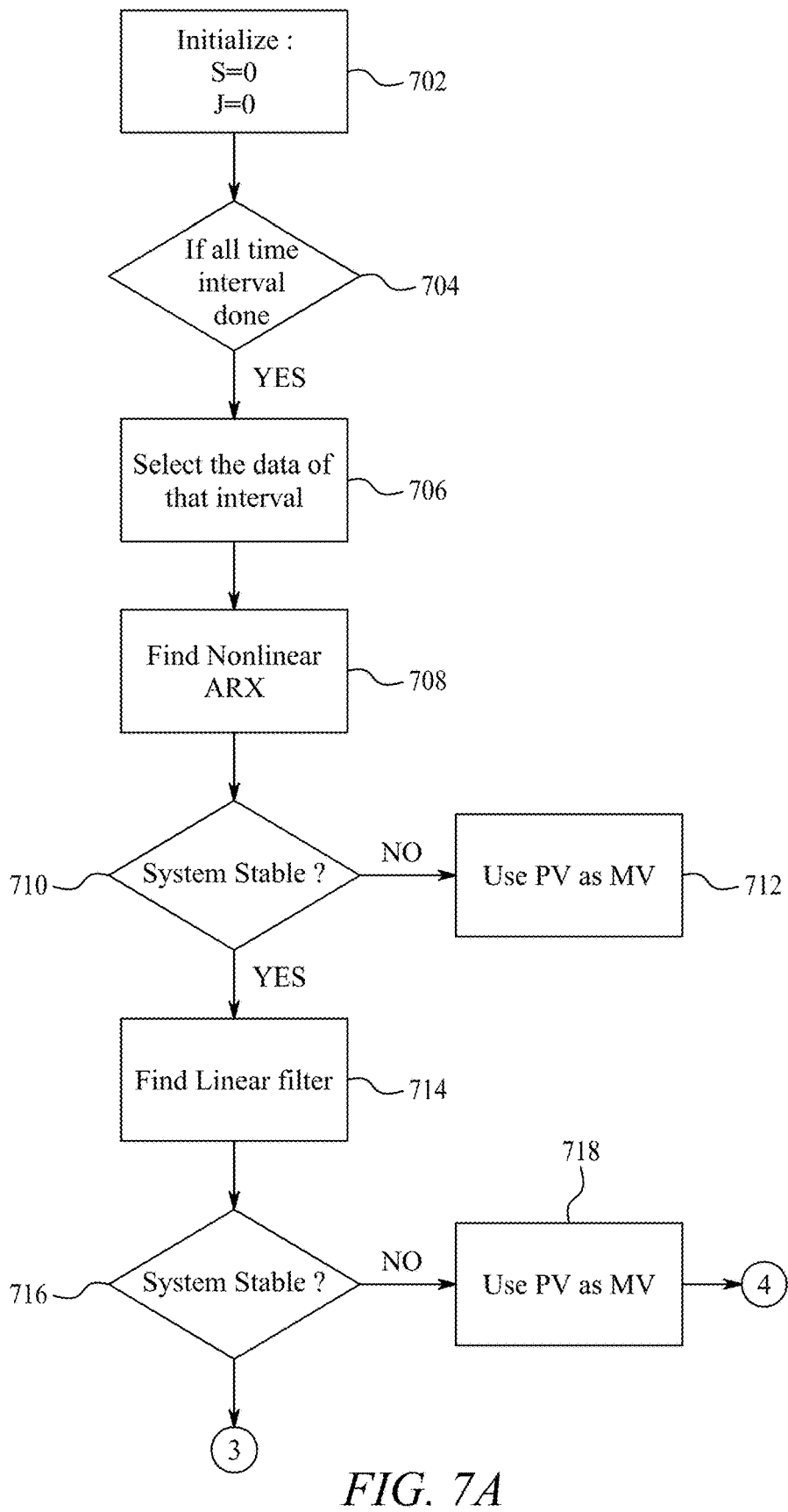
FIG. 7A depicts a flow chart for data analysis and determining optimal values for the S and the J, according to exemplary aspects of the present disclosure.

FIG. 7A depicts a flow chart for data analysis and determining optimal values for the S and the J, according to some embodiments. Step 702 includes initializing S and J to zero.

Step 704 includes determining if all time intervals are completed. If all the time intervals are completed then in step 706, the data of that time interval is selected. In step 708, the system processor 116 determines a nonlinear ARX. In step 710, the system processor 116 determine whether the system 100 is stable or not. If the system 100 is not stable, then in step 712, the PV is used as MV. If the system 100 is stable, then in step 714, the system processor 116 finds a linear filter to stabilize the system. In step 716, the system processor 116 determines whether the system is stable or not. If the system is not stable, then in step 718 the PV is used as the MV, and the process is advanced to step 722.

Figure 7B:
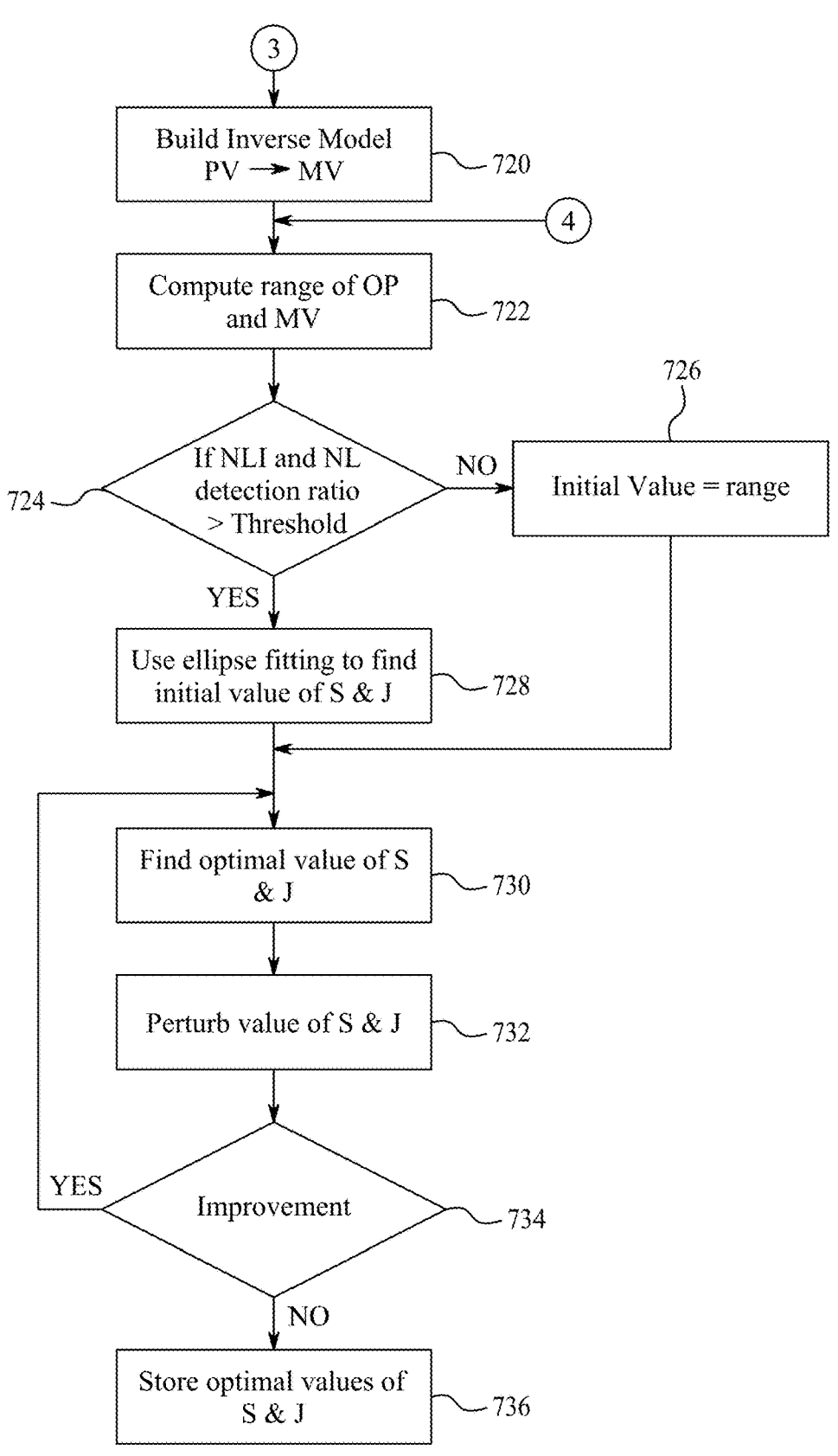
FIG. 7B is a continuation of flow chart of FIG. 7A illustrating additional steps, according to exemplary aspects of the present disclosure.

FIG. 7B is a continuation of flow chart of FIG. 7A illustrating additional steps, according to exemplary aspects of the present disclosure. Referring back to step 718, if the system is stable, then in step 720, the system processor 116 builds the inverse model. Step 722 includes computing the ranges of the OP and the MV. In step 722, the range of the OP and the MV is computed. In step 724, a determination is made as to whether or not the linear ARX model and the non-linear ARX model detection ratio is greater than threshold. If the linear ARX model and the non-linear ARX model detection ratio is less than the threshold, the initial value is set to the range value in step 726 and the process is advanced to step 730 to determine optimal values of S and J. If the linear ARX model and non-linear ARX model detection ratio is greater than the threshold, then in step 728, ellipse fitting is performed to find initial value of S and J, and the process is advanced to step 730. In step 732, value of S and J are perturbed. In step 734, it is determined whether there is an improvement or not. If there is an improvement, the process is moved back to step 730 to determine optimal values of S and J. if there is no improvement, in step 736, the identified optimal values of S and J are stored.

Figure 8:
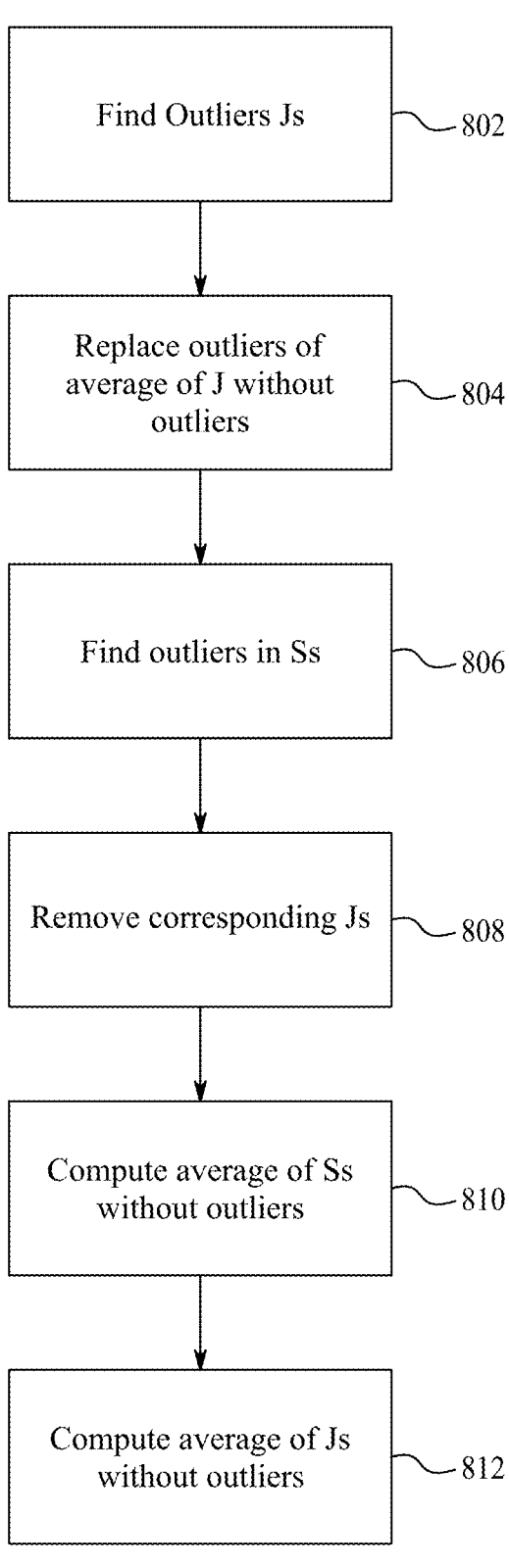
FIG. 8 is a process flow for determining averages of Ss and Js, according to exemplary aspects of the present disclosure.

FIG. 8 is a process flow for determining averages of the Ss and the Js, according to one embodiment.

In step 802, outlier J's are identified. In step 804, the outliers of average of J without outliers.

In step 806, the outliers in the S values are identified. In step 808, the corresponding J values are removed.

In step 810, average of the S values are computed without outliers. In step 812, the average of the J values are computed without outliers.

Figure 9A:
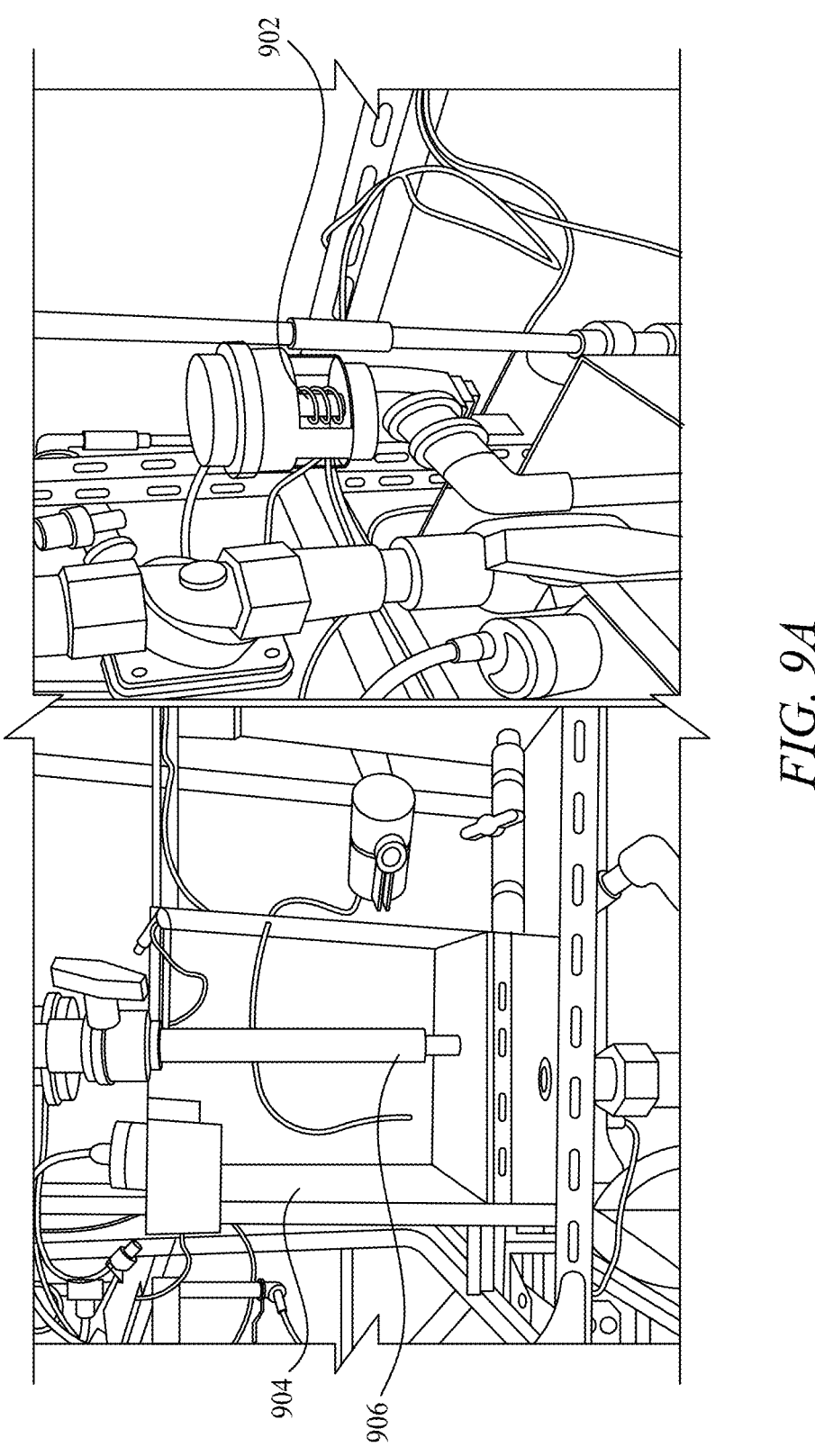
FIG. 9A-9C depict exemplary embodiments of the pneumatically controlled valve system, according to exemplary aspects of the present disclosure.

FIG. 9A depicts an exemplary experimental setup of the pneumatically controlled valve system 100, according to exemplary aspects of the present disclosure. The experimental setup includes a control valve 902, a tank 904, and a level transmitter 906. The level transmitter 906 may detect a level (for example, height or amount) of water in the tank 904. The level of water in the tank 904 may be used as the PV.

Figure 9B:
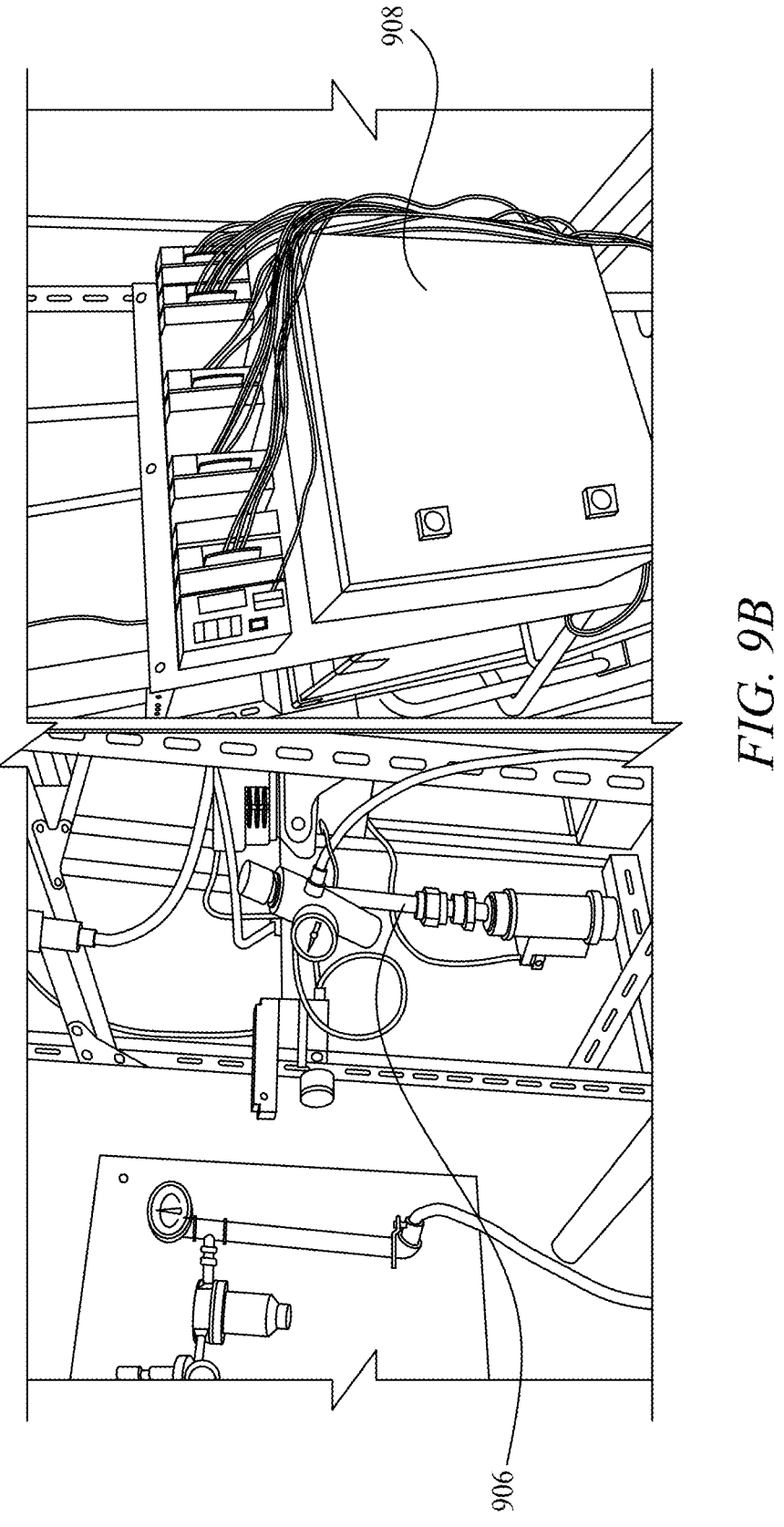

FIG. 9B depicts an exemplary experimental setup of the pneumatically controlled valve system 100, according to exemplary aspects of the present disclosure. The experimental setup includes an electrical-to-pressure converter 906 and a controller 908. In the experimental setup, the controller 908 used is a programmable automation controller, such as the Compact FieldPoint of National Instruments. The electrical-to-pressure converter 906 may use the control signals generated by the controller 908 to control pneumatic pressure to be applied to the actuator of the control valve 902.

Figure 9C:
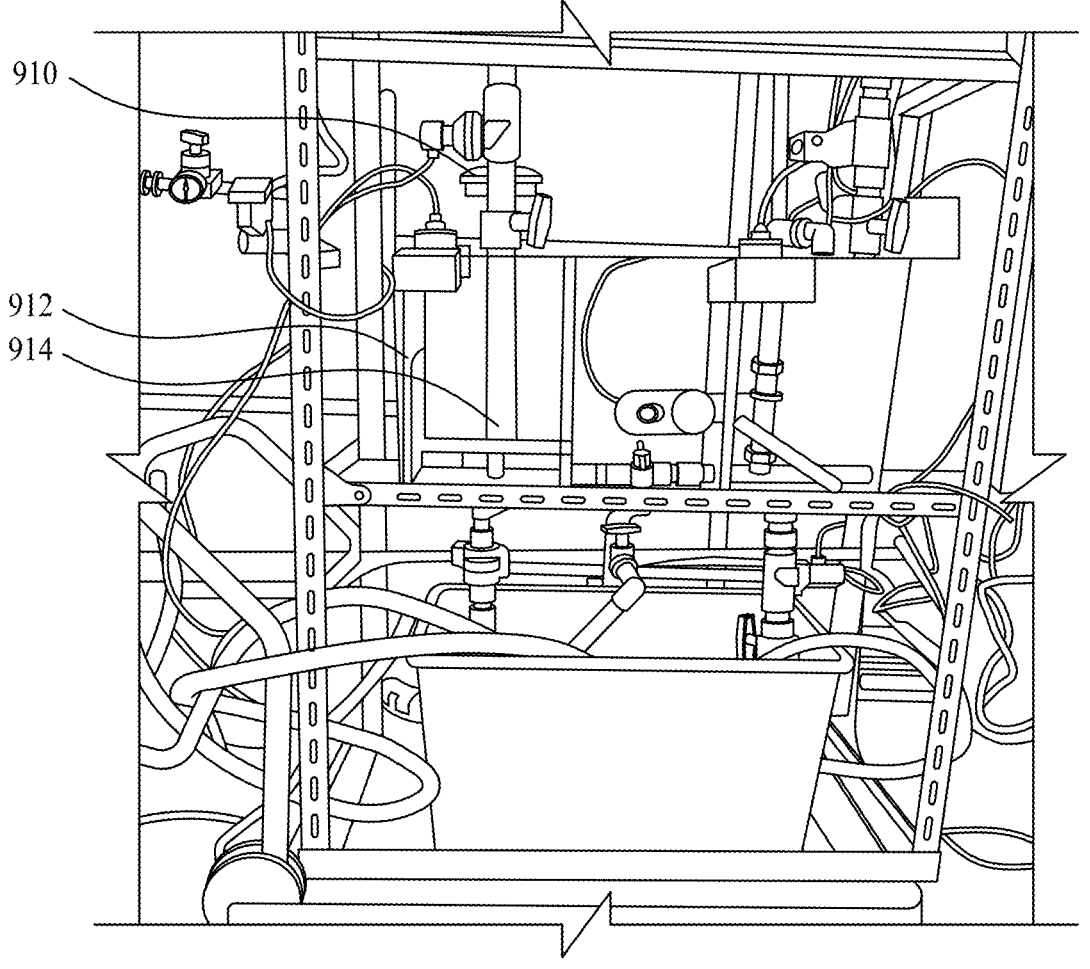

FIG. 9C depicts an exemplary experimental setup 900 of the pneumatically controlled valve system 100, according to exemplary aspects of the present disclosure. The experimental setup 900 includes the control valve 910, the tank 912, and the level transmitter 914. Although, for the sake of brevity, the exemplary experimental setup as depicted in FIG. 7 and FIG. 9 includes a singly control valve 902 (or

910), the exemplary experimental setup may be implemented at a production plant level with multiple control valves.

In an embodiment of the invention, stiction analysis is used to identify faulty valves or valves suffering stiction. A conventional valve suffering stiction may appear to operate acceptably while actually suffering problems such as creep and/or jump. For example, a valve may be manually or mechanically adjusted to a desired position using a control mechanism such as a valve knob or valve handle. Movement and adjustment of the control mechanism gives the valve an outer appearance that the valve has been properly adjusted. However, inside the valve a valve stem or valve joint may not fully extend or retract due to stiction in a valve body. This stiction problem is not immediately apparent from the outward appearance of the position valve control mechanism. Moreover, because a valve suffering stiction may at least partially function, initial indications of process variables such as flow rate may provide a misleading indication of proper functioning. Further still, the valve stem and/or valve body may subsequently slowly creep or jump into position finally yielding the desired process a variable making it further misleadingly appear that operation of the valve is normal notwithstanding a period of time during which the valve is not operating fully and process variables are out of a desired range. These issues may be especially critical during initial startup of a facility that includes conventional valves for fluid control. Such systems are common in chemical factories, food processing and gas processing facilities.

The first embodiment is illustrated with respect to FIGS. 1-9. The first embodiment describes a method for stiction analysis of a valve 104 operation in a fluid process plant. The method includes receiving, by the controller 102, a series of setpoint signals, SP, during a sampling interval, generating, by the controller 102, a series of controller output signals, OP, driving the valve 104 operation by applying the series of controller output signals, OP, to the valve 104, measuring a series of process variable signals, PV, downstream of the valve 104, receiving the series of process variable signals at the controller 102, performing inverse modelling on the series of process variable signals, PV, to estimate a manipulated variable, $\widehat{MV}$, receiving, within a sampling interval, by the system processor, the series of setpoint signals, SP, the series of controller output signals, OP, and the estimated manipulated variable, $\widehat{MV}$, analyzing, by the system processor, the series of setpoint signals, SP, the series of controller output signals, OP, and the estimated manipulated variable, $\widehat{MV}$, to estimate stick values, S, and jump values, J, in the valve operation during the sampling interval, and outputting, by the system processor, the estimated stick values, S, the estimated jump values, J, an average of the estimated stick values, an average of the estimated jump values, a confidence interval for the average of the stick values, and a confidence interval for the average of the jump values.

The method further includes generating, by the system processor, a first Fourier series by performing a first Fourier transform on each of the series of setpoint signals, SP, generating, by the system processor, a second Fourier series by performing a second Fourier transform on each of the series of controller output signals, OP, extracting a first fundamental wavelet frequency from the first Fourier series, extracting a second fundamental wavelet frequency from the second Fourier series, identifying a first, second and third harmonic of the first fundamental wavelet frequency, identifying a first, second and third harmonic of the second fundamental wavelet frequency, estimating, for each of the first, second and third harmonics of the first fundamental wavelet frequency, a first Fourier coefficient and a second Fourier coefficient, estimating, for each of the first, second and third harmonics of the second fundamental wavelet frequency, a third Fourier coefficient and a fourth Fourier coefficient, generating a setpoint dataset by truncating a first period and a last period of the first Fourier series, and generating a controller 102 output dataset by truncating a first period and a last period of the second Fourier series.

The method further includes clustering, by the system processor, the setpoint dataset to generate a plurality of setpoint clusters, ellipse fitting each setpoint cluster to determine a number of setpoint changes in each sampling interval of the setpoint cluster, comparing the number of setpoint changes to a first threshold, wherein the first threshold is greater than zero, when the number of setpoint changes is less than the first threshold, adding the sampling interval to a next sampling interval of the setpoint data points.

The method further includes when the number of setpoint data points is zero for each sampling interval: clustering the controller 102 output dataset to generate a plurality of controller 102 output clusters, ellipse fitting each controller 102 output cluster to determine a number of controller 102 output data points in each sampling interval of the controller 102 output cluster, comparing the number of controller 102 output data points to a second threshold, and when the number of controller 102 output data points is less than the second threshold, adding the sampling interval to a next sampling interval of the controller 102 output data points.

The method further includes clustering, by the system processor, the setpoint dataset for each sampling interval, to generate a plurality of setpoint clusters, applying a first global parametric operation to the plurality of setpoint clusters to determine in which setpoint clusters the setpoint changes, when there are setpoint changes in the setpoint clusters: grouping the setpoint clusters to form setpoint cluster groups in which the setpoint changes, performing stiction analysis on each setpoint cluster group in which the setpoint changes to determine stick, S, values and jump, J, values of each setpoint cluster group, removing outlying S values and outlying J values by ellipse fitting each setpoint cluster group for each sampling interval to generate cleaned setpoint cluster groups, averaging the S values of the cleaned setpoint cluster groups in each sampling interval to generate an average S value for each sampling interval, averaging the J values the cleaned setpoint cluster groups in each sampling interval to generate an average J value for each sampling interval, ellipse fitting the average S values to generate the estimated stick value, S, of the valve 104 operation for each sampling interval, and ellipse fitting the average J values to estimate the jump value, J, of the valve 104 operation for each sampling interval.

When there are no setpoint changes in the setpoint clusters, the method further includes counting the plurality of controller 102 output clusters, applying a second global parametric operation to the plurality of controller 102 output clusters to determine in which of the controller 102 output clusters the controller 102 output changes, grouping the controller 102 output clusters to form controller 102 output cluster groups in which the setpoint changes, performing stiction analysis on each controller 102 output cluster group in which the controller 102 output changes to determine stick, S, values and jump, J, values of each setpoint cluster group, removing outlying S values and outlying J values by ellipse fitting each controller 102 output cluster group for each sampling interval to generate cleaned controller 102 output cluster groups, averaging the S values of the cleaned controller 102 output cluster groups in each sampling interval to generate an average S value for each sampling interval, averaging the J values the cleaned controller 102 output cluster groups in each sampling interval to generate an average J value for each sampling interval, ellipse fitting the average S values to generate the estimated stick value, S, of the valve 104 operation for each sampling interval, and ellipse fitting the average J values to estimate the jump value, J, of the valve 104 operation for each sampling interval.

The first global parametric operation is performed by detecting a time instant in each of the set point clusters in which an amplitude of the setpoint changes, and determining each time interval when one of a root-mean-square difference does not change and a variance of the set point clusters does not change, and the second global parametric operation is performed by detecting a time instant in each of the controller 102 output clusters in which an amplitude of the controller 102 output changes, and determining each time interval wherein either a root-mean-square difference does not change and a variance of the set point clusters does not change.

The performing inverse modelling on the series of process variable signals, PV, includes identifying the valve 104 operation as a linear process, forming a model training dataset from a first half of the series of process variable signals, and a respective first half of the series of controller output signals, forming a model validation dataset from a second half of the series of process variable signals, PV, and a respective second half of the series of controller output signals, OP, training a first inverse auto regressive exogenous, ARX, linear model by performing inverse modelling on the first half of the series of process variable signals of the model training dataset, comparing the respective first half of the series of controller output signals to an output of the first inverse ARX model, and estimating a first set of parameters of the first inverse ARX linear model, validating the first set of parameters by applying the trained first inverse ARX linear model to the second half of the series of process variable signals of the model validation dataset and comparing an output of the trained first inverse ARX linear model to the respective second half of the series of controller output signals, OP, and determining that the first set of parameters are validated when a first difference between an absolute value of the output of the trained first inverse ARX linear model and an absolute value of the respective second half of the series of controller output signals is less than or equal to a validation threshold.

The method further includes determining that the trained first inverse ARX linear model having the first set of parameters is unstable when the absolute value of the output of the trained first inverse ARX linear model and the absolute value of the respective second half of the series of controller output signals is greater than the validation threshold, selecting a second inverse ARX linear model which includes a Finite Impulse Response, FIR, model, training the second inverse ARX linear model on the model training dataset to estimate a set of filter weights, validating the set of filter weights by applying the trained second inverse ARX linear model to the second half of the series of process variable signals of the model validation dataset and comparing an output of the trained second inverse ARX linear model to the respective second half of the series of controller output signals, OP, determining that the filter weights are validated when a first difference between an absolute value of the output of the trained second inverse ARX linear model and an absolute value of the respective second half of the series of controller output signals is less than or equal to the validation threshold, estimating the manipulated variable, $\widehat{MV}$, from a linear part of the output of the trained second inverse ARX linear model, and analyzing, by the system processor, the series of controller output signals, OP, and the estimated manipulated variable, $\widehat{MV}$, to determine stick values, S, and jump values, J, in the valve operation during each sampling interval.

The method further includes when the first difference is greater than the validation threshold, iteratively incrementing the first set of parameters and reapplying the trained first inverse ARX linear model having the incremented first set of parameters to the first half of the series of process variable signals of the model training dataset, until a second difference between the absolute value of the output of the trained first inverse ARX linear model having the incremented first set of parameters and the absolute value of the respective second half of the series of controller output signals is less than or equal to the validation threshold, wherein the second difference is less than the first difference.

The method further includes determining that the trained first inverse ARX linear model having the first set of parameters is unstable when the absolute value of the output of the trained first inverse ARX linear model and the absolute value of the respective second half of the series of controller output signals is greater than the validation threshold, training an inverse non-linear auto regressive exogenous, NLARX, model by performing inverse modelling on the first half of the series of process variable signals of the model training dataset, comparing the respective first half of the series of controller output signals to the output of the inverse NLARX model, and estimating a second set of parameters of the inverse NLARX model, validating the second set of parameters by applying the trained inverse NLARX model to the second half of the series of process variable signals of the model validation dataset and comparing an output of the trained inverse NLARX model to the respective second half of the series of controller output signals, OP, and determining that the second set of parameters are validated when a third difference between an absolute value of the output of the trained inverse NLARX model and an absolute value of the respective second half of the series of controller output signals, OP, is less than or equal to the validation threshold.

The method further includes when the third difference is greater than the validation threshold, iteratively incrementing the second set of parameters and reapplying the trained inverse NLARX model having the incremented second set of parameters to the first half of the series of process variable signals of the model training dataset, until a fourth difference between the absolute value of the output of the trained inverse NLARX model having the incremented second set of parameters and the absolute value of the respective second half of the series of controller output signals, OP, is less than or equal to the validation threshold, wherein the fourth difference is less than the third difference.

The method further includes comparing the second difference of the trained inverse ARX linear model to the fourth difference of the trained inverse NLARX model, determining the valve 104 operation is linear when the second difference is less than the fourth difference, and determining the valve 104 operation is non-linear when the second difference is greater than the fourth difference.

The method further includes estimating, by the system processor, the manipulated variable, $\widehat{MV}$ by one of the following: when the first difference is less than or equal to the validation threshold, estimating the manipulated variable, $\widehat{MV}$, from the output clusters of the trained inverse ARX linear model having the first set of parameters, when the first difference is greater than the validation threshold and the second difference is less than or equal to the validation threshold, estimating the manipulated variable, $\widehat{MV}$, from the output of the trained first inverse ARX linear model having the incremented first set of parameters, when the third difference is less than or equal to the validation threshold, and the third difference is less than or equal to the second difference, estimating the manipulated variable, $\widehat{MV}$, from a linear part of the output of the trained inverse NLARX model having the second set of parameters, and when the third difference is greater than the validation threshold and the fourth difference is less than or equal to the validation threshold and less than the second difference, estimating the manipulated variable, $\widehat{MV}$, from a linear part of the output of the trained inverse NLARX model having the incremented second set of parameters.

The method further includes when the first difference is less than or equal to the validation threshold, or when the first difference is greater than the validation threshold and the second difference is less than or equal to the validation threshold, estimating, by the system processor, the stick values, S, and jump values, J, in the valve operation from the series of setpoint signals, SP, and the series of controller output signals, OP, and when the third difference is less than or equal to the validation threshold, and the third difference is less than or equal to the second difference, or the third difference is greater than the validation threshold and the fourth difference is less than or equal to the validation threshold and less than the second difference, estimating, by the system processor, the stick values, S, and jump values, J, in the valve operation from the series of controller output signals, OP, and the estimated manipulated variable, $\widehat{MV}$.

The method further includes converting the process variables, PV, for each sampling interval, to a process variable percentage by calculating a difference between a maximum process variable and a minimum process variable, and dividing the difference by a sum of the process variables in each sampling interval, and converting the controller 102 output variables, OP, for each sampling interval, to a controller 102 output variable percentage by calculating a difference between a maximum controller 102 output variable and a minimum controller 102 output variable, and dividing the difference by a sum of the controller 102 output variables in each sampling interval.

The method further includes dividing the setpoint dataset into equal sampling intervals, performing the global parametric method to each sampling interval to detect each time instant when an amplitude of the setpoint signals changes and determining each time interval when one of a root-mean-square difference does not change and a variance of the set point signals does not change, calculating the stick values, S, and jump values, J, from the time instants when the amplitude of the setpoint values changes and one of the root-mean-square difference and the variance does not change, and calculating an average of the stick values, S, and an average of the jump values, J.

The second embodiment is illustrated with respect to FIGS. 1-9. The second embodiment describes a system for stiction analysis of valve operation in a fluid process plant. The system includes a controller 102 configured to receive a series of setpoint signals, SP, during a sampling interval and generate a series of controller output signals, OP, a valve 104 having an actuator 106, wherein the valve 104 is configured to be opened and closed by the actuator 106 to control a flow of a fluid through the valve 104, and wherein the actuator 106 is configured to be driven by the series of controller output signals, OP, the process variable sensor 108 located downstream of the valve 104, the process variable sensor 108 configured to detect changes in a flow rate of the fluid, and transmit process variable signals to the controller 102, the system processor 116 including circuitry, a memory configured to store program instructions and at least one operation processor configured to execute the program instructions, the system processor 116 configured to receive the setpoint signals, the controller 102 output signals, the process variable signals, and estimate a manipulated variable, $\widehat{MV}$, by inverse modelling of the process variable signals, the stiction processor 118 configured to estimate stick values, S, and jump values, J, of the valve 104 during the sampling interval, and a display 120 located in the system processor, wherein the system processor 116 is configured to render on the display 120, the estimated stick values, S, the estimated jump values, J, an average of the estimated stick values, an average of the estimated jump values, a confidence interval for the average of the stick values, and a confidence interval for the average of the jump values.

The system further includes a set of clustering processors located in the system processor, wherein the set of clustering processors include a first inverse auto regressive exogenous, ARX, linear model, a second inverse ARX linear model which includes a Finite Impulse Response, FIR, model, and an inverse non-linear auto regressive exogenous, NLARX, model, a global parametric model processor located in the system processor, wherein the global parametric model processor is configured to detect changes in one of the series of setpoint signals, SP, and the series of controller output signals, OP, in each sampling interval, and wherein the system processor 116 is configured to select a clustering processor to cluster the setpoint signals depending on one of a number of the changes in one of the series of setpoint signals, SP, and a number of the changes the series of controller output signals, OP.

The third embodiment is illustrated with respect to FIGS. 1-9. The third embodiment describes a non-transitory computer readable medium having instructions stored therein that, when executed by one or more processors, cause the one or more processors to perform a method or stiction analysis of valve 104 operation in a process plant. The method includes receiving, by a controller 102, a series of setpoint signals, SP, during a sampling interval, generating, by the controller 102, a series of controller output signals, OP, driving the valve 104 operation by applying the series of controller output signals, OP, to the valve 104, measuring a series of process variable signals, PV, downstream of the valve 104, feeding back the series of process variable signals to the controller 102, performing inverse modelling on the series of process variable signals, PV, to estimate a manipulated variable, $\widehat{MV}$, receiving, within a sampling interval, by the system processor, the series of setpoint signals, SP, the series of controller output signals, OP, and the estimated manipulated variable, $\widehat{MV}$, analyzing, by the system processor, the series of setpoint signals, SP, the series of controller output signals, OP, and the estimated manipulated variable, $\widehat{MV}$, to estimate stick values, S, and jump values, J, in the valve 104 operation during the sampling interval, and outputting, by the system processor, the estimated stick values, S, the estimated jump values, J, an average of the estimated stick values, an average of the estimated jump values, a confidence interval for the average of the stick values, and a confidence interval for the average of the jump values.

Figure 10:
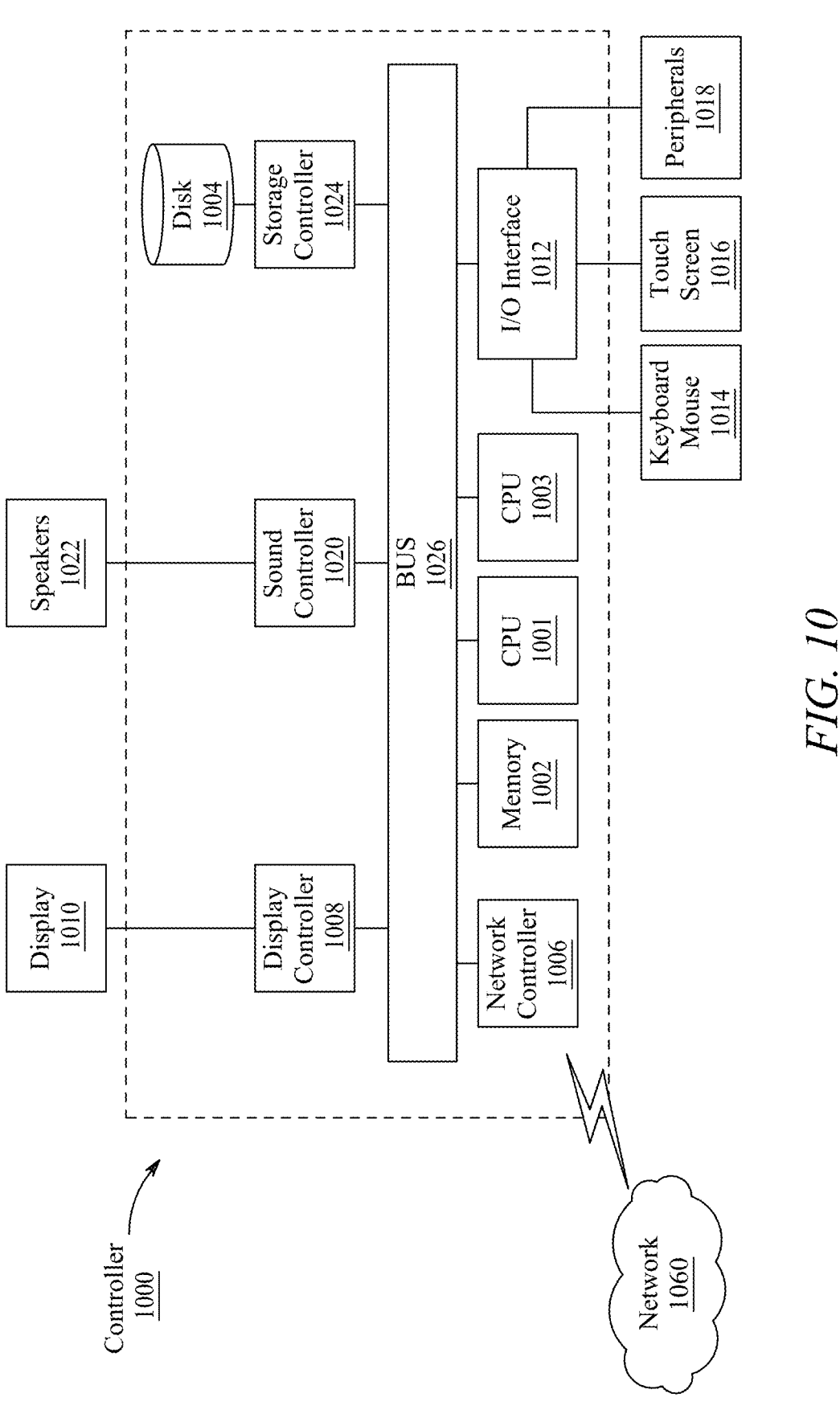
FIG. 10 is an illustration of a non-limiting example of details of computing hardware used in the computing system, according to exemplary aspects of the present disclosure.

FIG. 10 is an illustration of a non-limiting example of details of computing hardware used in the computing system, according to exemplary aspects of the present disclosure. In FIG. 10, a controller 1000 is described which is a computing device, such as the advisory tool system 202 and the computing unit 302. The controller 1000 includes a CPU 1001 which performs the processes described above/below. The process data and instructions may be stored in memory 1002. These processes and instructions may also be stored on a storage medium disk 1004 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1001, 1003 and an operating system such as Microsoft Windows 7, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 1001 or CPU 1003 may be a Xenon or Core processor from Intel of America or an Opteron processor from AMD of America, or may be other processor types that would be recognized by one of ordinary skill in the art. Alternatively, the CPU 1001, 1003 may be implemented on an FPGA, ASIC, PLD or using discrete logic circuits, as one of ordinary skill in the art would recognize. Further, CPU 1001, 1003 may be implemented as multiple processors cooperatively working in parallel to perform the instructions of the inventive processes described above.

The computing device in FIG. 10 also includes a network controller 1006, such as an Intel Ethernet PRO network interface card from Intel Corporation of America, for interfacing with network 1060. As can be appreciated, the network 1060 can be a public network, such as the Internet, or a private network such as an LAN or WAN network, or any combination thereof and can also include PSTN or ISDN sub-networks. The network 1060 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1008, such as a NVIDIA GeForce GTX or Quadro graphics adaptor from NVIDIA Corporation of America for interfacing with display 1010, such as a Hewlett Packard HPL2445w LCD monitor. A general purpose I/O interface 1012 interfaces with a keyboard and/or mouse 1014 as well as a touch screen panel 1016 on or separate from display 1010. General purpose I/O interface also connects to a variety of peripherals 1018 including printers and scanners, such as an OfficeJet or DeskJet from Hewlett Packard.

A sound controller 1020 is also provided in the computing device such as Sound Blaster X-Fi Titanium from Creative, to interface with speakers/microphone 1022 thereby providing sounds and/or music.

The general-purpose storage controller 1024 connects the storage medium disk 1004 with communication bus 1026, which may be an ISA, EISA, VESA, PCI, or similar, for interconnecting all of the components of the computing device. A description of the general features and functionality of the display 1010, keyboard and/or mouse 1014, as well as the display controller 1008, storage controller 1024, network controller 1006, sound controller 1020, and general purpose I/O interface 1012 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 11.

Figure 11:
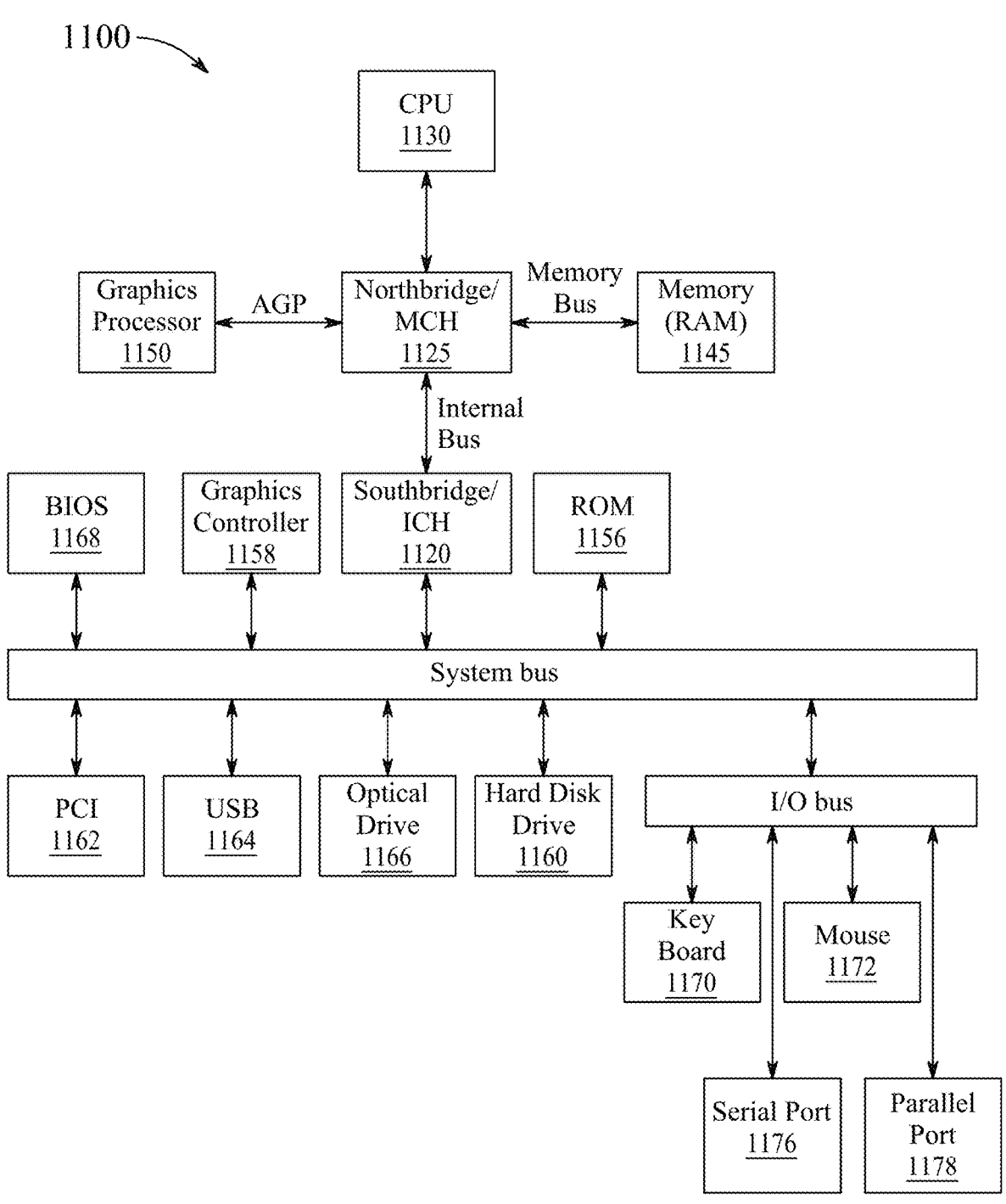
FIG. 11 is an exemplary schematic diagram of a data processing system used within the computing system, according to exemplary aspects of the present disclosure.

FIG. 11 shows a schematic diagram of a data processing system, according to certain embodiments, for performing the functions of the exemplary embodiments. The data processing system is an example of a computer in which code or instructions implementing the processes of the illustrative embodiments may be located.

In FIG. 11, data processing system 1100 employs a hub architecture including a north bridge and memory controller hub (NB/MCH) 1125 and a south bridge and input/output (I/O) controller hub (SB/ICH) 1120. The central processing unit (CPU) 1130 is connected to NB/MCH 1125. The NB/MCH 1125 also connects to the memory 1145 via a memory bus, and connects to the graphics processor 1150 via an accelerated graphics port (AGP). The NB/MCH 1125 also connects to the SB/ICH 1120 via an internal bus (e.g., a unified media interface or a direct media interface). The CPU Processing unit 1130 may contain one or more processors and even may be implemented using one or more heterogeneous processor systems.

Figure 12:
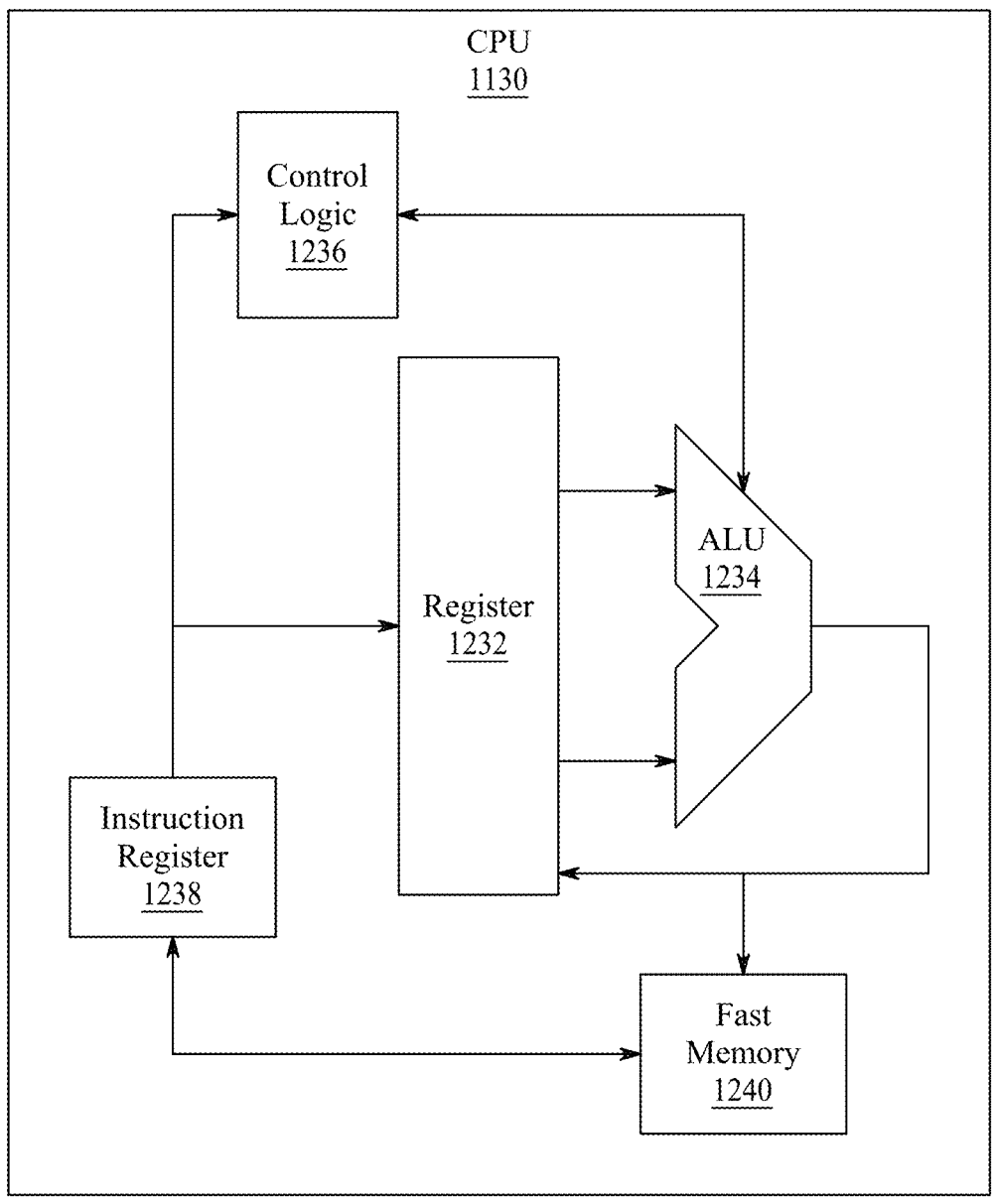
FIG. 12 is an exemplary schematic diagram of a processor used with the computing system, according to exemplary aspects of the present disclosure.

For example, FIG. 12 shows one implementation of CPU 1130. In one implementation, the instruction register 1238 retrieves instructions from the fast memory 1240. At least part of these instructions are fetched from the instruction register 1238 by the control logic 1236 and interpreted according to the instruction set architecture of the CPU 1130. Part of the instructions can also be directed to the register 1232. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 1234 that loads values from the register 1232 and performs logical and mathematical operations on the loaded values according to the instructions. The results from these operations can be feedback into the register and/or stored in the fast memory 1240. According to certain implementations, the instruction set architecture of the CPU 1130 can use a reduced instruction set architecture, a complex instruction set architecture, a vector processor architecture, a very large instruction word architecture. Furthermore, the CPU 1130 can be based on the Von Neuman model or the Harvard model. The CPU 1130 can be a digital signal processor, an FPGA, an ASIC, a PLA, a PLD, or a CPLD. Further, the CPU 1130 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 11, the data processing system 1100 can include that the SB/ICH 1120 is coupled through a system bus to an I/O Bus, a read only memory (ROM) 1156, universal serial bus (USB) port 1164, a flash binary input/output system (BIOS) 1168, and a graphics controller 1158. PCI/PCIe devices can also be coupled to SB/ICH 1188 through a PCI bus 1162.

The PCI devices may include, for example, Ethernet adapters, add-in cards, and PC cards for notebook computers. The Hard disk drive 1160 and CD-ROM 1166 can use, for example, an integrated drive electronics (IDE) or serial advanced technology attachment (SATA) interface. In one implementation the I/O bus can include a super I/O (SIO) device.

Further, the hard disk drive (HDD) 1160 and optical drive 1166 can also be coupled to the SB/ICH 1120 through a system bus. In one implementation, a keyboard 1170, a mouse 1172, a parallel port 1178, and a serial port 1176 can be connected to the system bus through the I/O bus. Other peripherals and devices that can be connected to the SB/ICH 1120 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for stiction analysis of a valve operation in a fluid process plant, the fluid process plant comprising a controller, a valve having an actuator that is configured to open and close the valve to control a flow of a fluid through the valve, a process variable sensor located downstream of the valve to detect changes in a flow rate of the fluid, and a system processor further comprising a stiction processor and a display, the method comprising:

receiving, by the controller, a series of setpoint signals, SP, during a sampling interval;

generating, by the controller, a series of controller output signals, OP;

applying the series of controller output signals, OP, from the controller to the actuator of the valve to drive the valve operation;

measuring, by the process variable sensor, a series of process variable signals, PV, downstream of the valve;

receiving the series of process variable signals at the controller;

performing, by the system processor, inverse modelling on the series of process variable signals, PV, to estimate a manipulated variable, $\widehat{MV}$;

receiving, within the sampling interval, by the system processor, the series of setpoint signals, SP, and the series of controller output signals, OP;

analyzing, by the stiction processor, the series of setpoint signals, SP, the series of controller output signals, OP, and the estimated manipulated variable, $\widehat{MV}$, to estimate stick values, S, and jump values, J, in the valve operation during the sampling interval;

rendering, by the system processor, on the display, the estimated stick values, S, the estimated jump values, J, an average of the estimated stick values, an average of the estimated jump values, a confidence interval for the average of the stick values, and a confidence interval for the average of the jump values;

generating, by the system processor, based on a result of the analyzing by the stiction processor, an output representing a non-linear dynamic of the valve caused by stiction, and feeding the output to the controller; and by the controller, taking into account the non-linear dynamic and generating the series of controller output signals, OP, for controlling the actuator to compensate for the non-linear dynamic.

2. The method of claim 1, further comprising:

generating, by the system processor, a first Fourier series by performing a first Fourier transform on each of the series of setpoint signals, SP;

generating, by the system processor, a second Fourier series by performing a second Fourier transform on each of the series of controller output signals, OP;

extracting a first fundamental wavelet frequency from the first Fourier series;

extracting a second fundamental wavelet frequency from the second Fourier series;

identifying a first, second and third harmonic of the first fundamental wavelet frequency;

identifying a first, second and third harmonic of the second fundamental wavelet frequency;

estimating, for each of the first, second and third harmonics of the first fundamental wavelet frequency, a first Fourier coefficient and a second Fourier coefficient;

estimating, for each of the first, second and third harmonics of the second fundamental wavelet frequency, a third Fourier coefficient and a fourth Fourier coefficient;

generating a setpoint dataset by truncating a first period and a last period of the first Fourier series; and generating a controller output dataset by truncating a first period and a last period of the second Fourier series.

3. The method of claim 2, further comprising:

clustering, by the system processor, the setpoint dataset to generate a plurality of setpoint clusters;

ellipse fitting each setpoint cluster to determine a number of setpoint changes in each sampling interval of the setpoint cluster;

comparing the number of setpoint changes to a first threshold, wherein the first threshold is greater than zero;

when the number of setpoint changes is less than the first threshold, adding the sampling interval to a next sampling interval of the setpoint data points.

4. The method of claim 3, further comprising:

when the number of setpoint data points is zero for each sampling interval:

clustering the controller output dataset to generate a plurality of controller output clusters;

ellipse fitting each controller output cluster to determine a number of controller output data points in each sampling interval of the controller output cluster;

comparing the number of controller output data points to a second threshold; and when the number of controller output data points is less than the second threshold, adding the sampling interval to a next sampling interval of the controller output data points.

5. The method of claim 2, further comprising:

clustering, by the system processor, the setpoint dataset for each sampling interval, to generate a plurality of setpoint clusters;

applying a first global parametric operation to the plurality of setpoint clusters to determine in which setpoint clusters the setpoint changes;

when there are setpoint changes in the setpoint clusters:

grouping the setpoint clusters to form setpoint cluster groups in which the setpoint changes;

performing stiction analysis on each setpoint cluster group in which the setpoint changes to determine stick, S, values and jump, J, values of each setpoint cluster group;

removing outlying S values and outlying J values by ellipse fitting each setpoint cluster group for each sampling interval to generate cleaned setpoint cluster groups;

averaging the S values of the cleaned setpoint cluster groups in each sampling interval to generate an average S value for each sampling interval;

averaging the J values the cleaned setpoint cluster groups in each sampling interval to generate an average J value for each sampling interval;

ellipse fitting the average S values to generate the estimated stick value, S, of the valve operation for each sampling interval; and ellipse fitting the average J values to estimate the jump value, J, of the valve operation for each sampling interval.

6. The method of claim 5, further comprising:

when there are no setpoint changes in the setpoint clusters:

counting the plurality of controller output clusters;

applying a second global parametric operation to the plurality of controller output clusters to determine in which of the controller output clusters the controller output changes;

grouping the controller output clusters to form controller output cluster groups in which the setpoint changes;

performing stiction analysis on each controller output cluster group in which the controller output changes to determine stick, S, values and jump, J, values of each setpoint cluster group;

removing outlying S values and outlying J values by ellipse fitting each controller output cluster group for each sampling interval to generate cleaned controller output cluster groups;

averaging the S values of the cleaned controller output cluster groups in each sampling interval to generate an average S value for each sampling interval;

averaging the J values the cleaned controller output cluster groups in each sampling interval to generate an average J value for each sampling interval;

ellipse fitting the average S values to generate the estimated stick value, S, of the valve operation for each sampling interval; and ellipse fitting the average J values to estimate the jump value, J, of the valve operation for each sampling interval.

7. The method of claim 6, wherein:

the first global parametric operation is performed by detecting a time instant in each of the set point clusters in which an amplitude of the setpoint changes, and determining each time interval when one of a root-mean-square difference does not change and a variance of the set point clusters does not change; and the second global parametric operation is performed by detecting a time instant in each of the controller output clusters in which an amplitude of the controller output changes, and determining each time interval wherein either a root-mean-square difference does not change and a variance of the set point clusters does not change.

8. The method of claim 2, where performing inverse modelling on the series of process variable signals, PV, comprises:

identifying the valve operation as a linear process;

forming a model training dataset from a first half of the series of process variable signals, and a respective first half of the series of controller output signals;

forming a model validation dataset from a second half of the series of process variable signals, PV, and a respective second half of the series of controller output signals, OP;

training a first inverse auto regressive exogenous, ARX, linear model by performing inverse modelling on the first half of the series of process variable signals of the model training dataset, comparing the respective first half of the series of controller output signals to an output of the first inverse ARX model; and estimating a first set of parameters of the first inverse ARX linear model;

validating the first set of parameters by applying the trained first inverse ARX linear model to the second half of the series of process variable signals of the model validation dataset and comparing an output of the trained first inverse ARX linear model to the respective second half of the series of controller output signals, OP; and determining that the first set of parameters are validated when a first difference between an absolute value of the output of the trained first inverse ARX linear model and an absolute value of the respective second half of the series of controller output signals is less than or equal to a validation threshold.

9. The method of claim 8, further comprising:

determining that the trained first inverse ARX linear model having the first set of parameters is unstable when the absolute value of the output of the trained first inverse ARX linear model and the absolute value of the respective second half of the series of controller output signals is greater than the validation threshold;

selecting a second inverse ARX linear model which includes a Finite Impulse Response, FIR, model;

training the second inverse ARX linear model on the model training dataset to estimate a set of filter weights;

validating the set of filter weights by applying the trained second inverse ARX linear model to the second half of the series of process variable signals of the model validation dataset and comparing an output of the trained second inverse ARX linear model to the respective second half of the series of controller output signals, OP;

determining that the filter weights are validated when a first difference between an absolute value of the output of the trained second inverse ARX linear model and an absolute value of the respective second half of the series of controller output signals is less than or equal to the validation threshold;

estimating the manipulated variable, $\widehat{MV}$, from a linear part of the output of the trained second inverse ARX linear model; and analyzing, by the system processor, the series of controller output signals, OP, and the estimated manipulated variable, $\widehat{MV}$, to determine stick values, S, and jump values, J, in the valve operation during each sampling interval.

10. The method of claim 8, further comprising:

when the first difference is greater than the validation threshold, iteratively incrementing the first set of parameters and reapplying the trained first inverse ARX linear model having the incremented first set of parameters to the first half of the series of process signals of the model training dataset, until a second difference between the absolute value of the output of the trained first inverse ARX linear model having the incremented first set of parameters and the absolute value of the respective second half of the series of controller output signals is less than or equal to the validation threshold, wherein the second difference is less than the first difference.

11. The method of claim 8, further comprising:

determining that the trained first inverse ARX linear model having the first set of parameters is unstable when the absolute value of the output of the trained first inverse ARX linear model and the absolute value of the respective second half of the series of controller output signals is greater than the validation threshold;

training an inverse non-linear auto regressive exogenous, NLARX, model by performing inverse modelling on the first half of the series of process variable signals of the model training dataset, comparing the respective first half of the series of controller output signals to the output of the inverse NLARX model; and estimating a second set of parameters of the inverse NLARX model;

validating the second set of parameters by applying the trained inverse NLARX model to the second half of the series of process variable signals of the model validation dataset and comparing an output of the trained inverse NLARX model to the respective second half of the series of controller output signals, OP; and determining that the second set of parameters are validated when a third difference between an absolute value of the output of the trained inverse NLARX model and an absolute value of the respective second half of the series of controller output signals, OP, is less than or equal to the validation threshold.

12. The method of claim 11, further comprising:

when the third difference is greater than the validation threshold, iteratively incrementing the second set of parameters and reapplying the trained inverse NLARX model having the incremented second set of parameters to the first half of the series of process variable signals of the model training dataset, until a fourth difference between the absolute value of the output of the trained inverse NLARX model having the incremented second set of parameters and the absolute value of the respective second half of the series of controller output signals, OP, is less than or equal to the validation threshold, wherein the fourth difference is less than the third difference.

13. The method of claim 12, further comprising:

comparing the second difference of the trained inverse ARX linear model to the fourth difference of the trained inverse NLARX model;

determining the valve operation is linear when the second difference is less than the fourth difference; and determining the valve operation is non-linear when the second difference is greater than the fourth difference.

14. The method of claim 13, further comprising:

estimating, by the system processor, the manipulated variable, $\widehat{MV}$ by one of the following:

when the first difference is less than or equal to the validation threshold, estimating the manipulated variable, $\widehat{MV}$, from the output clusters of the trained inverse ARX linear model having the first set of parameters;

when the first difference is greater than the validation threshold and the second difference is less than or equal to the validation threshold, estimating the manipulated variable, $\widehat{MV}$, from the output of the trained first inverse ARX linear model having the incremented first set of parameters;

when the third difference is less than or equal to the validation threshold, and the third difference is less than or equal to the second difference, estimating the manipulated variable, $\widehat{MV}$, from a linear part of the output of the trained inverse NLARX model having the second set of parameters; and when the third difference is greater than the validation threshold and the fourth difference is less than or equal to the validation threshold and less than the second difference, estimating the manipulated variable, $\widehat{MV}$, from a linear part of the output of the trained inverse NLARX model having the incremented second set of parameters.

15. The method of claim 14, further comprising:

when the first difference is less than or equal to the validation threshold, or when the first difference is greater than the validation threshold and the second difference is less than or equal to the validation threshold, estimating, by the system processor, the stick values, S, and jump values, J, in the valve operation from the series of setpoint signals, SP, and the series of controller output signals, OP; and when the third difference is less than or equal to the validation threshold, and the third difference is less than or equal to the second difference, or the third difference is greater than the validation threshold and the fourth difference is less than or equal to the validation threshold and less than the second difference, estimating, by the system processor, the stick values, S, and jump values, J, in the valve operation from the series of controller output signals, OP, and the estimated manipulated variable, $\widehat{MV}$.

16. The method of claim 15, further comprising:

converting the process variables, PV, for each sampling interval, to a process variable percentage by calculating a difference between a maximum process variable and a minimum process variable, and dividing the difference by a sum of the process variables in each sampling interval; and converting the converting the controller output variables, OP, for each sampling interval, to a controller output variable percentage by calculating a difference between a maximum controller output variable and a minimum controller output variable, and dividing the difference by a sum of the controller output variables in each sampling interval.

17. The method of claim 2, further comprising:

dividing the setpoint dataset into equal sampling intervals;

performing the global parametric method to each sampling interval to detect each time instant when an amplitude of the setpoint signals changes and determining each time interval when one of a root-mean-square difference does not change and a variance of the set point signals does not change;

calculating the stick values, S, and jump values, J, from the time instants when the amplitude of the setpoint values changes and one of the root-mean-square difference and the variance does not change; and calculating an average of the stick values, S, and an average of the jump values, J.

18. A system for stiction analysis of valve operation in a fluid process plant, comprising:

a controller configured to receive a series of setpoint signals, SP, during a sampling interval and generate a series of controller output signals, OP;

a valve having an actuator, wherein the valve is configured to be opened and closed by the actuator to control a flow of a fluid through the valve, and wherein the actuator is configured to be driven by the series of controller output signals, OP;

a process variable sensor located downstream of the valve, the process variable sensor configured to detect changes in a flow rate of the fluid, and transmit process variable signals to the controller;

a system processor including circuitry, a memory configured to store program instructions and at least one operation processor configured to execute the program instructions, the system processor being configured to receive the setpoint signals, the controller output signals, the process variable signals, and estimate a manipulated variable, $\widehat{MV}$, by inverse modelling of the process variable signals, the system processor further comprising a stiction processor and a display, wherein the stiction processor is configured to estimate stick values, S, and jump values, J, of the valve during the sampling interval, and wherein the system processor is configured to render on the display, the estimated stick values, S, the estimated jump values, J, an average of the estimated stick values, an average of the estimated jump values, a confidence interval for the average of the stick values, and a confidence interval for the average of the jump values.

19. The system of claim 18, further comprising:

a set of clustering processors located in the system processor, wherein the set of clustering processors include a first inverse auto regressive exogenous, ARX, linear model, a second inverse ARX linear model which includes a Finite Impulse Response, FIR, model; and an inverse non-linear auto regressive exogenous, NLARX, model a global parametric model processor located in the system processor, wherein the global parametric model processor is configured to detect changes in one of the series of setpoint signals, SP, and the series of controller output signals, OP, in each sampling interval; and wherein the system processor is configured to select a clustering processor to cluster the setpoint signals depending on one of a number of the changes in one of the series of setpoint signals, SP, and a number of the changes the series of controller output signals, OP.

20. A non-transitory computer readable medium having instructions stored therein that, when executed by one or more processors, cause the one or more processors to perform a method for stiction analysis of valve operation in a process plant, the fluid process plant comprising a controller, a valve having an actuator that is configured to open and close the valve to control a flow of a fluid through the valve, a process variable sensor located downstream of the valve to detect changes in a flow rate of the fluid, and a system processor further comprising a stiction processor and a display, the method comprising:

receiving, by the controller, a series of setpoint signals, SP, during a sampling interval;

generating, by the controller, a series of controller output signals, OP;

applying the series of controller output signals, OP, from the controller to the actuator of the valve to drive the valve operation;

measuring, by the process variable sensor, a series of process variable signals, PV, downstream of the valve;

feeding back the series of process variable signals to the controller;

performing, by the system processor, inverse modelling on the series of process variable signals, PV, to estimate a manipulated variable, $\widehat{MV}$;

receiving, within the sampling interval, by the system processor, the series of setpoint signals, SP, and the series of controller output signals, OP;

analyzing, by the stiction processor, the series of setpoint signals, SP, the series of controller output signals, OP, and the estimated manipulated variable, $\widehat{MV}$, to estimate stick values, S, and jump values, J, in the valve operation during the sampling interval;

rendering, by the system processor, on the display, the estimated stick values, S, the estimated jump values, J, an average of the estimated stick values, an average of the estimated jump values, a confidence interval for the average of the stick values, and a confidence interval for the average of the jump values;

generating, by the system processor, based on a result of the analyzing by the stiction processor, an output representing a non-linear dynamic of the valve caused by stiction, and feeding the output to the controller; and by the controller, taking into account the non-linear dynamic and generating the series of controller output signals, OP, for controlling the actuator to compensate for the non-linear dynamic.

21. The method of claim 1, wherein the step of applying the series of controller output signals to the actuator to drive the valve operation further comprises: opening or closing the valve with the actuator according to the series of controller output signals to control the flow of the fluid through the valve.

\* \* \* \* \*